United States Patent [19]

Langdon, Jr. et al.

[11] Patent Number: 5,097,261
[45] Date of Patent: Mar. 17, 1992

[54] DATA COMPRESSION FOR RECORDING ON A RECORD MEDIUM

[75] Inventors: Glen G. Langdon, Jr., San Jose, Calif.; Neil H. MacLean, Jr., Tucson; Robert W. Miller, Tucson; Mayank R. Patel, Tucson, all of Ariz.

[73] Assignee: International Business Machines Corporation, Armonk, N.Y.

[21] Appl. No.: 615,665

[22] Filed: Nov. 19, 1990

Related U.S. Application Data

[63] Continuation of Ser. No. 441,126, Nov. 22, 1989, abandoned.

[51] Int. Cl.[5] ............................................. H03M 7/30
[52] U.S. Cl. ........................................... 341/51; 341/87
[58] Field of Search ................ 341/51, 60, 55, 87, 341/95, 106, 107

[56] References Cited

U.S. PATENT DOCUMENTS

| | | | |
|---|---|---|---|
| 4,125,881 | 11/1978 | Eige et al. | 360/50 |
| 4,393,445 | 7/1983 | Milligan et al. | 364/200 |
| 4,403,286 | 9/1983 | Fry et al. | 364/200 |
| 4,423,480 | 12/1983 | Bauer et al. | 364/200 |
| 4,435,762 | 3/1984 | Milligan et al. | 364/200 |
| 4,467,317 | 8/1984 | Langdon, Jr. et al. | 341/107 |
| 4,603,382 | 7/1986 | Cole et al. | 364/200 |
| 4,749,983 | 6/1988 | Langdon, Jr. et al. | 341/51 |
| 4,881,075 | 11/1989 | Weng | 341/87 |
| 4,899,147 | 2/1990 | Schiavo et al. | 341/60 |
| 4,929,946 | 5/1990 | O'Brien et al. | 341/87 |

Primary Examiner—Howard L. Williams
Attorney, Agent, or Firm—James A. Pershon

[57] ABSTRACT

A tape drive system includes a compaction scheme whereby the data to be stored on the media is encoded and formatted to take less space along the tape length. The data to be written to tape is placed into equal byte lengths or sets. The sets of data are directed to a plurality of encoders in turn and compacted through an Arithmetic Binary Coding program having two statistic tables per encoder to allow format compatibility with a higher throughput compaction scheme. The compacted sets are sequenced and formed into packets. Then the packets are autoblocked to delineate the packets while providing a single Inter Block Gap per autoblock length and written on the tape. On read, the data is retrieved from the tape and deblocked to separate the packets. Each packet is separated into compacted sets of data. The compacted sets are directed to a plurality of decoders in turn and decompacted. The decompacted sets are to resequenced to place the data into the same state as originally transmitted.

53 Claims, 8 Drawing Sheets

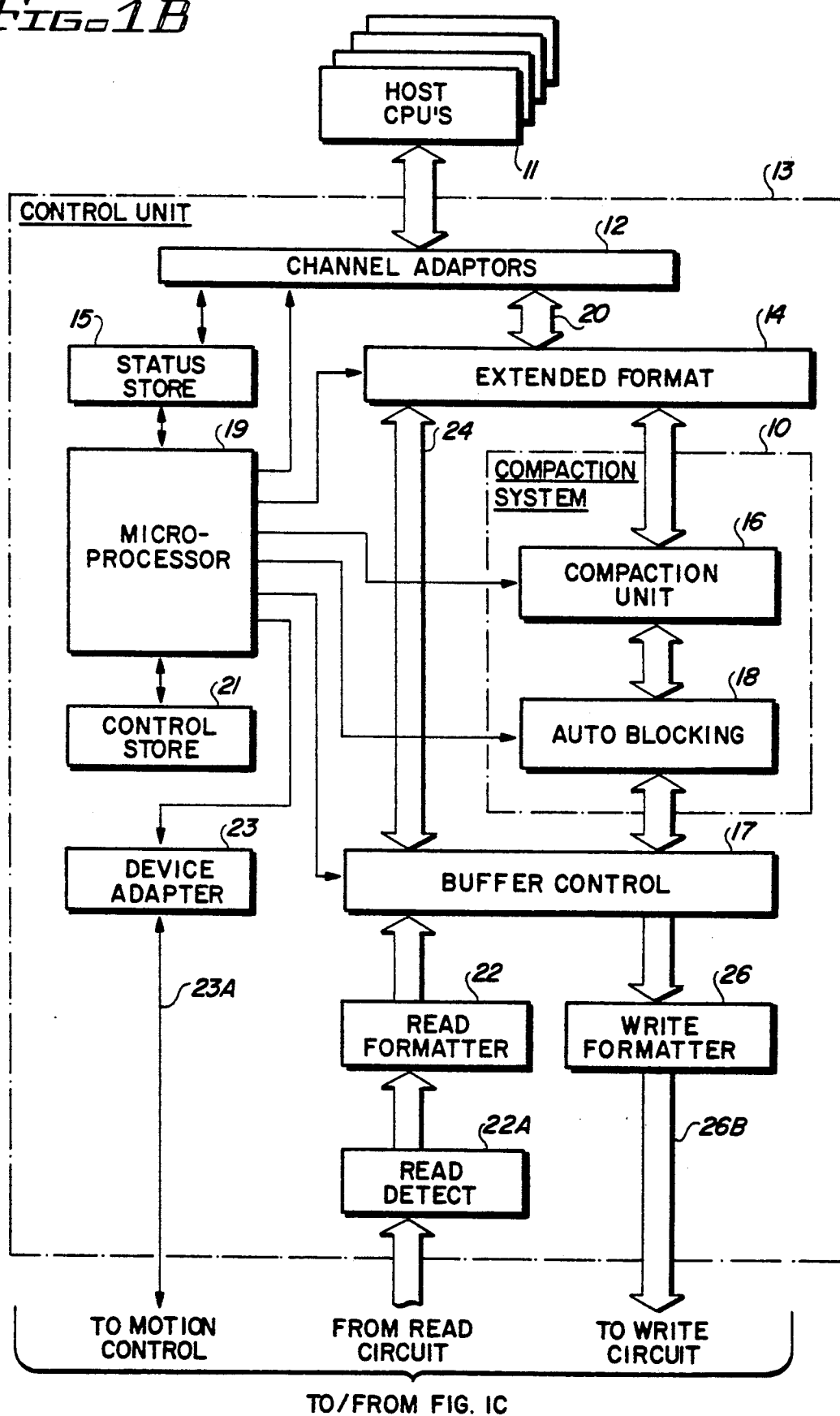

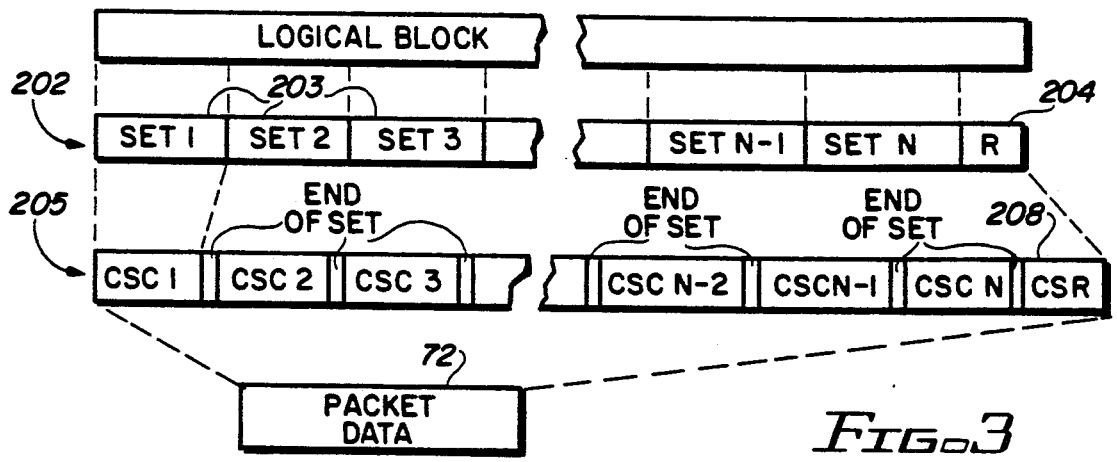
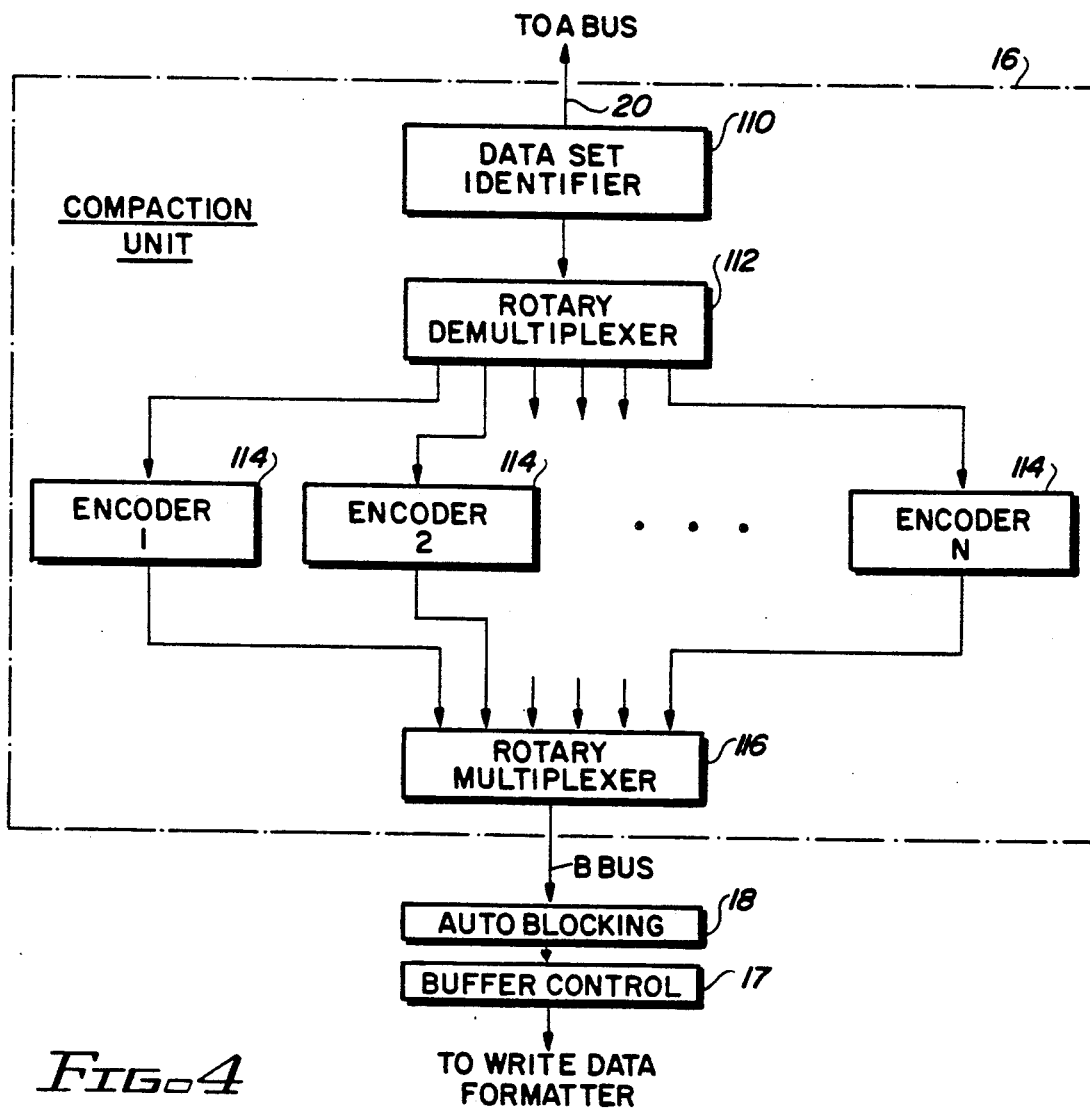

DATA COMPRESSION FOR RECORDING ON A RECORD MEDIUM

This is a continuation application of application Ser. No. 07/441,126, filed Nov. 22, 1989, now abandoned.

DOCUMENTS INCORPORATED BY REFERENCE

Milligan, et al., U.S. Pat. No. 4,393,445; Milligan, et al., U.S. Pat. No. 4,435,762; Cole, et al., U.S. Pat. No. 4,603,382; Bauer, et al., U.S. Pat. No. 4,423,480; Fry, et al., U.S. Pat. No. 4,403,286 show a magnetic tape subsystem with which the present invention is advantageously employed and shows the initiation and control of reading and recording operations in such a tape subsystem.

CROSS-REFERENCES TO RELATED MATERIALS

Related copending Patent Applications are Ser. No. 07/372,744, filed on June 28, 1989, entitled "Combining Small Records Into A Single Block For Recording On A Record Media", Dunn et al.; Ser. No. 07/441,127, filed on Nov. 22, 1989, entitled "Control And Sequencing Of Multiple Parallel Processing Devices", MacLean, et al.; and Ser. No. 07/441,681, filed on Nov. 22, 1989, entitled "Format Compatibility In Compression/Decompression Devices", MacLean, et al.

FIELD OF THE INVENTION

The present invention relates generally to digital signal recording devices, and in particular, to peripheral subsystems and the supervisory control of the subsystems to store compacted data onto a record medium and to retrieve the completed data for decompaction.

BACKGROUND OF THE INVENTION

Information processing systems, which handle ever increasing amounts of data, require data storage devices that also have the ability to handle the increasing amounts of data. This data is generally stored on magnetic disks and tapes, and optical devices. The increased amount of data requires an increasing number of disks and tapes to store the data for later usage.

In order to reduce the number of media, disks and tapes for instance, a compaction scheme can be used, such that a lower amount of the media items are used to store the data. The increased number of record media has precipitated the increase in the number of tracks and the number of transitions per track, in order to get more and more data stored on each record media. The limitations of the number of transitions that can be recorded onto the media has led to the use of compaction processes to increase the effective amount of data onto each record media.

It is, therefore, an object of the present invention to provide an enhanced data compression procedure for storing an increased amount of data onto a record media.

The compaction schemes of the prior art were not fast enough to compact a Data Stream presently used to transfer the information to the record media, and to maintain a given data rate for the uncompressed data. Extensive compression hardware was used, together with elaborate buffering schemes in order to match the high speed of the data channels in the transfer of the Data Stream to the record media with that of the slower speed required by the data compression units. The encoding of the data into the compressed data form required extensive logic gates and other hardware, in order to accomplish the control operation of the compression scheme. The decoding of the compressed data then required another section of elaborate logic units and other hardware, to accomplish the reverse, i.e., to make the compressed data usable to the information processing system while handling the data at the speed which present day information processing systems process data.

SUMMARY OF THE INVENTION

The compaction system of the present invention, to write the data from the channel adaptors of the host processors onto the media, first partitions the data into manageable entities or sets of data.

These sets are each distributed in turn through hardware acting as a demultiplexer to a plurality of encoders of a compaction unit for compression. Each encoder includes a plurality of statistic tables, two for the preferred embodiment, to allow format compatibility with the increased throughput of the Binary Arithmetic encoder by adding units while reducing the required hardware and providing the expansion to a higher throughput configuration. The compacted sets of data are resequenced in a multiplex hardware procedure to assemble the compacted sets into packet data and delineated to identify the individual compacted sets. The compacted sets are demultiplexed through the delineations to distribute each compacted set of data to one of a plurality of decoders of the compaction unit, for decompression of the data. Each decoder includes a plurality of statistic tables, two for the preferred embodiment, to allow format compatibility and increase the throughput with the plurality of decoders, while similarly reducing the required hardware and providing expansion to a higher throughput configuration. The decompacted sets are resequenced through a multiplexer procedure to reassemble the decompacted sets of data into their original form for transmission to the channel adaptors for use by the host computers.

It is, therefore, another object of the present invention to provide an enhanced hardware that permits the high speed transfer of data from the information processing system, along its channels, to the compressed data scheme onto the record media.

The present invention provides a binary arithmetic compaction (BAC) on data as it is transferred in the media controller between the channel and the data processing system for storing onto the media. The compaction accomplished is variable, depending on the content of the data. When compaction is used, the net result is that the storage requirement is reduced. The composition of the data stored on the media is thereby increased, which has the added advantage of increasing the effective data rate of the media controller.

Autoblocking is automatically provided when the compaction of the data is active. A number of compacted records or packets are accumulated in the control unit buffer before the compacted data is sent for writing on the media. A special record format is then used to concentrate the records into a single, physical block on the media. Autoblocking increases the amount of the data stored on the media by reducing the control information generally inserted between records onto the media. The effective data rate is increased, since less time is required to write and process the control information. For retrieving the recorded data, the packets are deblocked through delineations to remove the formatting data.

In the recapture and reading of the compacted data, the compacted data is decoded and transferred through the channel adaptors to the data processing system, using the same hardware as that provided for the encoding steps. The encoding and decoding of the data is performed using separate hardware, but the remaining portion of the logic devices is used for buffering and otherwise controlling the transfer of data between the channel adaptor of the data processor and the write-to-media process.

Another object of the present invention, therefore, is to provide an enhanced system for the effective storage and retrieval of data onto a record medium.

The invention of this application partitions the records into manageable entities or sets and processes the data through a compaction system, that can be expanded or contracted to process the Data Stream at a desired maximum variable data rate. The number of encoders and decoders used in succession is dependent upon the rate of the data transferred from the channel, with each successive encoder and decoder handling the compaction and decompaction, respectively, in parallel. The number of encoders and decoders used can expand and contract, depending upon the maximum data rate required. By choosing the appropriate number of encoders and decoders, and how many statistic tables in each, data format compatibility is maintained.

Yet another object of the present invention, therefore, is to provide a compaction processor that can be adapted to the throughput rate inherent of the data to compress and process the data at the higher rate required by present day record processing systems.

Still another object is to provide a total compression scheme that is adaptable to the data that is to be stored on media.

In the total attribute of the present invention, a control unit, through channel adaptors, accepts the requests from host central processing units to control a device such as a magnetic tape recording device. The device could also be a magnetic disk or optical recording device. Also, the device could be a plurality of recorders within the aspects of this invention.

The control of the device for media motion control is through a microprocessor and a device adaptor, and a motion control unit generally in the device. The motion control unit controls the carriage control for handling of the insertion and extraction of the media, the threading mechanism, if the media is a tape held within a cartridge, for placing the media in contact with a transducer for reading and writing onto the media. The motion control also controls the speed and tension of the tape media for correct interaction with the transducer.

The data transfer to and from the media via the transducer is through read and write circuits and formatters to a buffer control which operates under the control of the microprocessor to adapt the data useable by the host CPU into the type of data for storage onto a utilization device, the media device. The compaction and decompaction of the data by the control unit for storage and retrieval to and from the devices is through a compaction system. The data from the channel adaptor is compacted in a compaction unit and an autoblocking unit of the compaction system and then written onto the media by the transducer for storage. To retrieve the compacted data, the transducer reads the data from the media as the media is transported past the transducer under control of the motion control and the control unit. The data read by the transducer is amplified and converted, and directed through a buffer control to be decompressed by the compaction system to return the compressed data to the original state for transmission to the channel adaptors and the host CPU.

Thus, the present invention provides a compaction system for compacting and decompacting data, a means for directing data received from a host CPU to the compaction system, a device for handling a storage media, a means for controlling the motion of the storage media in the device, a means for transforming the compacted data into a format for placement onto the storage media, a transducer for storing and retrieving the formatted compacted data to and from the media, means for transforming the retrieved, formatted compacted data into compacted data, means for directing the retrieved compacted data to the compaction system for decompaction, means for directing the decompacted data to the host CPU, and means, under control of the host CPU, to direct the transfer of data through the controls and the device and the placement and retrieval of the data to and from the storage media.

The foregoing and other (objects), features and advantages of the invention will be apparent from the following more particular description of (a) preferred embodiment(s) of the invention, as illustrated in the accompanying drawing(s)

BRIEF DESCRIPTION OF THE DRAWING(S)

The various novel features of this invention, along with the foregoing and other objects, as well as the invention itself both as to its organization and method of operation, may be more fully understood from the following description of illustrated embodiments when read in conjunction with the accompanying drawing, wherein:

FIG. 1A is a high level flow block diagram of a data processing system of the present invention;

FIGS. 1B and C are a more specific flow block diagram of FIG. 1A;

FIG. 3 is a format of the data as directed from the channel adaptors to the recording medium as shown in the flow diagram of FIG. 1A;

FIG. 4 is a diagrammatic representation of the compaction system of FIG. 1A, showing the write data flow;

DETAILED DESCRIPTION

Figure 1A:
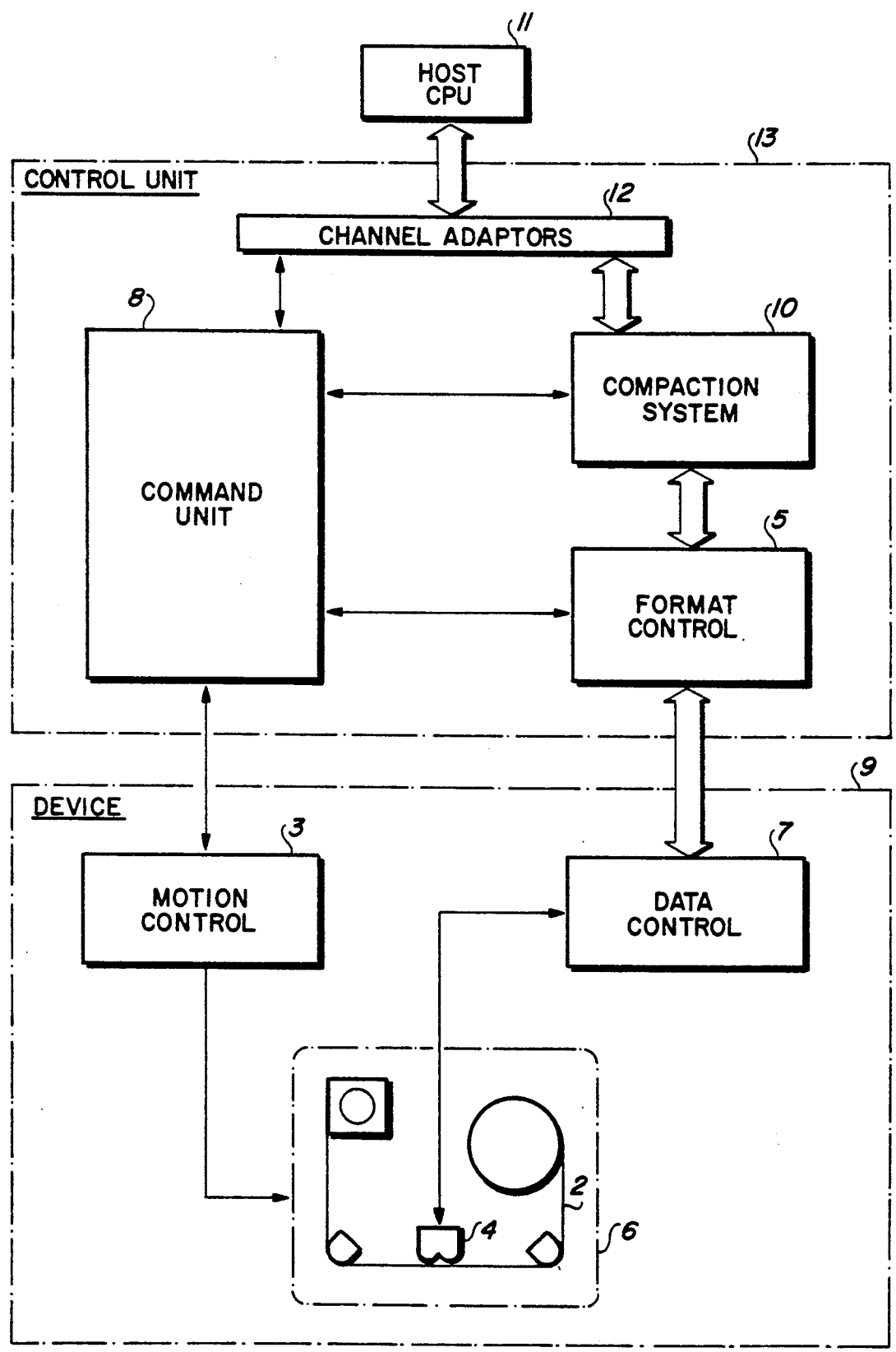
FIG. 1D is a generalized flow block diagram of the control unit of FIG. 1A.

The present invention is preferably for use with a controller and a magnetic tape device and, in particular, is for use in the IBM 3480 Tape Drive System. The best mode described herein will, therefore, be for a magnetic tape system, but it should be understood that the invention could be adapted for use in any storage system, especially magnetic disk and tape systems and optical storage systems.

The requirements for the physical formatting and recording of data, on a one half inch magnetic tape stored in a cartridge, provide for data interchange between recording systems. The format of the IBM 3480 Tape Drive provides for a recording on 18 tracks. The format of this invention provides capabilities that increase cartridge capacity and, when combined with the compaction scheme of the data processing system according to the present invention, achieves significantly increased cartridge capabilities. Since the amount of compaction achieved is heavily dependent upon the type of data being compacted and the compaction format, a single number defining the capacity of the cartridge is not possible. However, using average data, an effective cartridge capacity of 600 to 1000 mega bytes is assumed to be reasonable. Magnetic tape cartridge technology has shown a continuous pattern of advancement in the areas of recording density, reliability, and ease of use. It is expected that this trend will continue and that this invention will be the basis for future advancements. The present invention provides an effective process for the compaction of data, typical, for instance, to a magnetic tape drive system, and also provides a minimum amount of hardware requirements for the generation of compacted data for data interchange between the host computer and the recording systems.

The present invention covers an efficient method of compacting most types of information processed data into sufficiently smaller data blocks for recording on the magnetic tape media. The new hardware as provided by this invention can be added to the current hardware of an IBM 3480 Tape Drive and Controller. Thereby, the system provides the advancements gained with this invention while continuing to interchange data with the users of the host data processing system when necessary.

Referring more particularly to the drawing, the same reference numerals indicate like structural features and operations in the various figures of the drawing. In general, referring to FIG. 1A, a data processing subsystem is controlled by a plurality of host central processing units (CPU) 11 to store and retrieve data that is required by the host units. The data processing subsystem includes at least one control unit 13 and at least one device. The control unit 13 accepts the commands and data from the hosts 11 via channel adaptor 12 and controls itself and the devices accordingly. The devices could be magnetic tape recording devices 9 as shown in the preferred embodiment, or magnetic disk or optical recorders.

Figure 1C:
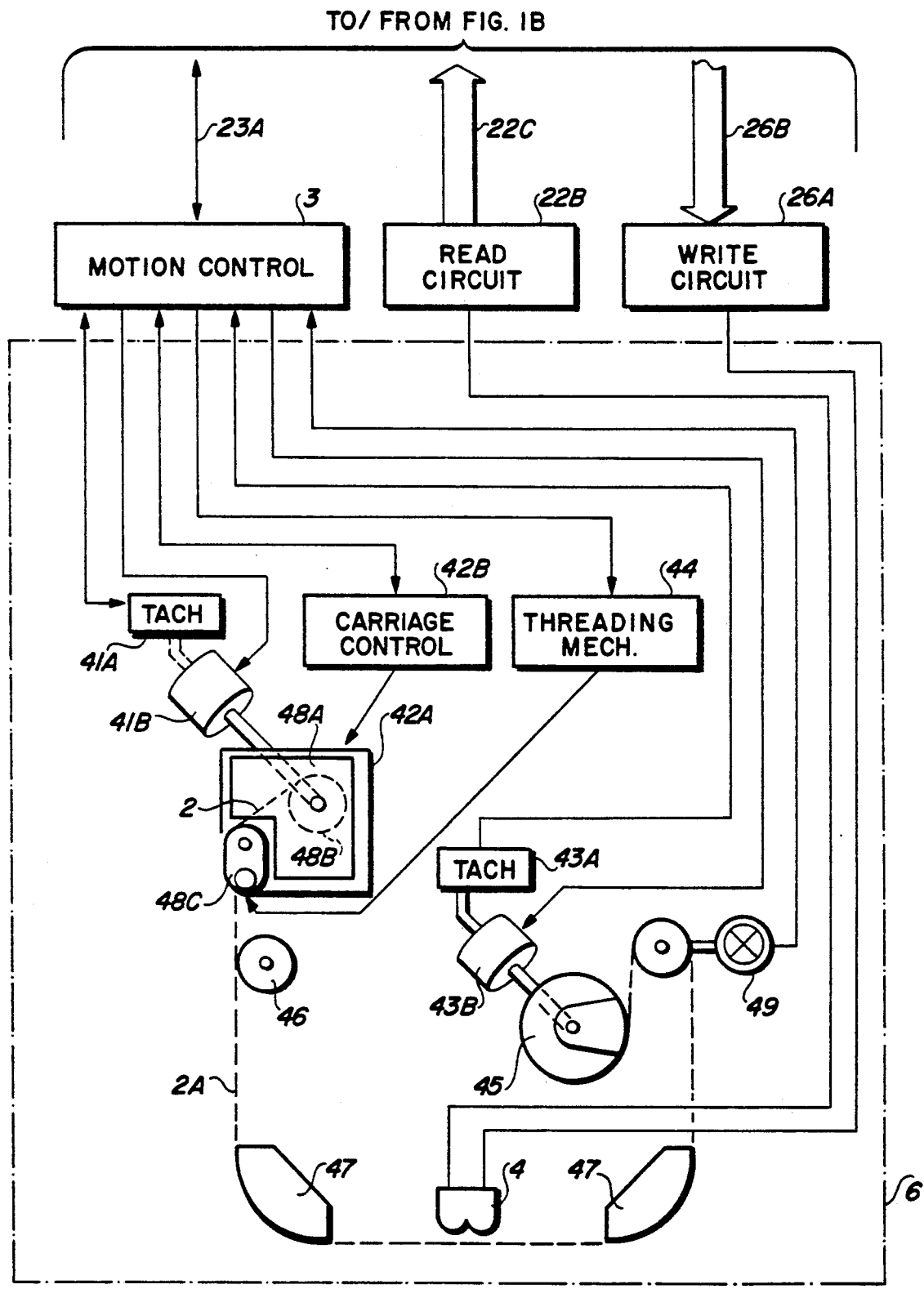

The magnetic tape recording device 9 includes a means for controlling the handling of the tape media, a motion control 3, and the device mechanism in a drive 6 for transporting a tape 2 past a transducer 4 for writing and reading data to and from the tape media. Generally a data control 7 provides read and write circuits in the device 9 to operate the transducer 4. The data control 7 is connected by a cable to a format control 5 in the control unit 13. The format control 5 is shown connected by a data cable to a compaction system 10 which in turn is connected to the channel adaptor 12. The motion control 3 is controlled by a command unit 8 in the control unit 13. The command unit 8 takes the commands transmitted to the channel adaptors 12 by the hosts 11 and controls the operations of the drive 6 via the motion control 3 and the flow of data to and from the channel adaptors 12 through the format control 5 and the data control 7. A compaction system 10 is shown inserted into the data flow to compact and decompact the data for storage on the tape media 2 and retrieval from the tape media 2, respectively. FIGS. 1B and 1C show a more detailed block diagram of the data processing system of FIG. 1A. FIG. 1B shows a block diagram of the control unit 13 and FIG. 1C shows a block diagram of the device 9. The bottom of FIG. 1B is connected by cable and command lines to the top of FIG. 1C.

Referring to FIGS. 1B and 1C, the command unit 8 of FIG. 1A includes a status store 15, a microprocessor 19, a control store 21 and a device adaptor 23. An extended format 14 is essentially a part of the command unit 8 in the control of the data flow. The extended format 14 provides the capability of providing no compaction or decompaction of the data by bypassing the compaction system 10 as shown by a data cable 24. A buffer control 17 operates under control of the microprocessor 19 to store the data written on tape 2 by the write formatter 26 and the write circuit 26A of FIG. 1C to the transducer 4. The buffer control 17 also controls the data flow on a read cycle to store the data processed by a read circuit 22B from the transducer 4 and transmitted to a read detect 22A over connecting cable 22C and to a read formatter 22 to the buffer control 17. The compaction system 10 includes a compaction unit 16 and an auto blocking unit 18 as will be further discussed in FIG. 1D.

The tape recording device 9 of FIG. 1C shows the drive 6 under control of the motion control 3 to accomplish the controlled transporting of the tape 2 past the transducer 4 to accomplish the read and writing of the magnetic transition onto the tape 2 and useful in the present invention. The tape recording device 9 includes a supply reel motor 41B and a tachometer control 41A, a carriage 42A and a carriage control 42B, a take up reel 45 and its motor drive 43B and tachometer control 43A, a threading mechanism 44, various controls of a tape path 2A such as idler 46, compliant tape guides 47 and a tape tension control 49. The tape media 2 of this preferred embodiment is contained in a cartridge 48A shown placed into the carriage 42A. The cartridge 48A, besides the tape 2, includes a supply reel 48B and a leader block 48C, shown connected for threading by the threading mechanism 44.

Referring now more particularly to the drawing, like numbers indicate like parts and structural features in the various figures. In FIGS. 1A-C, a data processing system is shown including a magnetic tape recorder storage subsystem connected via its control unit 13 to a host system 11 including a plurality of central processing units. The magnetic tape recorder storage subsystem includes the control unit and the magnetic tape device 9. The control unit 13 provides data transfers between a plurality of devices, one indicated as being a reel-to-reel type of magnetic tape recorder 9, and the host system 11 via a plurality of channel adaptors 12. The host system 11 requests for data transfers either to or from the devices 9. All operations of the control unit 13 and the devices 9 depend upon commands and other control data received from the host system 11 through the channel adaptor 12. The total subsystem status is maintained in the control unit 13 via the status store 15. The status store 15 includes a plurality of registers containing bytes relating to device status, buffer status, channel status, and the like. Such status information reflects the selection status of the device 9, its busy status, contingent connection and all other status necessary for operating the storage subsystem with the channel adaptors 12.

A programmed microprocessor 19 operates in accordance with a microcode program stored in a control store 21. Such microprograms enable the microprocessor 19 to completely manage a buffer control 17 to provide and supervise the data flow between the channel adaptors and the device 9. The microprocessor 19 supervises and enables the selection of the channel adaptors 12. A device adaptor 23, controlled and supervised by the microprocessor 19, controls the operation of the motion control system 3. A separate device adaptor 23 controls each of the plurality of tape recorder devices 9. The microprocessor 19, using known techniques, selects the microprograms of the control store 21 as commanded by the host CPU 11. Control data is supplied from the control store 21, including microprogramming instruction words. The microprocessor 19 is interrupt driven through a plurality of interrupt levels. These interrupts are supplied by the various elements of the control unit 13, the priority of which is preassigned in accordance with the functions to be performed in the control unit 13 and the tape recorder device 9.

A representation of the tape recorder device 9 is shown in FIG. 1B. Reference is made to a U.S. Pat. No. 4,125,881 to Eige, et al., for a more complete description of a control circuit useable for a reel-to-reel tape drive. Only the apparatus and procedure for an understanding of the present invention is given herein. As shown in FIG. 1B, the tape recorder device 9 includes the supply reel tachometer 41A which is connected to the supply reel motor 41B. The supply reel motor 41B is driven by the motion control 3 to reversibly rotate the supply reel 48B shown located within the single reel cartridge 48A. The tachometer 41B indicates to the motion control the number of rotations and the rotational position of the motor 41B and the supply reel 42, 3. The take up reel tachometer 43A is connected to the take up reel motor 43B that is reversibly driven by the motion control 25. The motor 44 drives the take up reel 45. The tape, in the preferred embodiment the magnetic tape 2, takes a path, shown by a dotted line 2A from the supply reel 48B to the take up reel 45 past the idler bearing 46, the air bearing guides 47 and the magnetic head 4. The tape path continues around the guide of the tension arm transducer 49 to the take up reel 45.

Thus, for the discussion of FIG. 1B, the motion control unit 3, after the entry of a supply reel 48A onto the clutch drive (not shown), activates the motor 41B. The entry of the cartridge 48A into the carriage 42A activates the carriage control 42B which in turn causes the motion control unit 3 to activate the motor 41B. The motion control 3 directs a threading operation by activating the threading mechanism 44 which will pull the tape through its path 2A past idler bearing 46, air bearing guides 47, magnetic head 4, and the tension arm transducer 49 onto the take up reel 45. In the reading and/or writing of information onto the tape via the magnetic head 48, the speed of the motors 41B and 43B are controlled by the motion controls 3 through the tachometers 41A and 43A, respectively. The writing of information onto the tape 2 is accomplished through the write formatter 26 which places the data to be written into its format for placement onto the tape. The output of the write formatter 26 from the control unit 13 is directed to the write circuit 26A in the tape recorder device 9. The write circuit 26A controls the magnetic transducer 4 to accomplish the writing of the data onto the tape 2.

To retrieve or read the information that was written onto the tape 2, the read circuitry is activated. The magnetic transducer 4 will sense the magnetic transitions written onto the tape 2 and will direct its analog output to the read circuit 22B. The read circuit 22B amplifies the analog signals received from the magnetic transducer 48 and directs its output to the read detect 22A in the control unit 13. The read detect 22A circuitry converts the analog signal to the digital signal required for the control unit 13. The output of the read detect 22A is directed to the read formatter 22 to direct the digital read information for storage in the buffer control 17.

The actual control of the operation of reel tape recorder device 9 as shown in FIG. 1B is accomplished through the the microprocessor 19 of the control unit 13. The device adaptor 23 includes tag control lines and bus data transfer lines which enables the control unit 13 to closely control and operate the tape recorder device 9 through the motion control 3.

The microprocessor 19 controls the buffer control 17 to accomplish the reading and writing of the data to and from the tape and also through the device adaptor 23 and the motion control 3 controls the transport of the tape 2 over the magnetic transducer 4 to accomplish the actual reading and writing of the data itself.

Figure 1D:
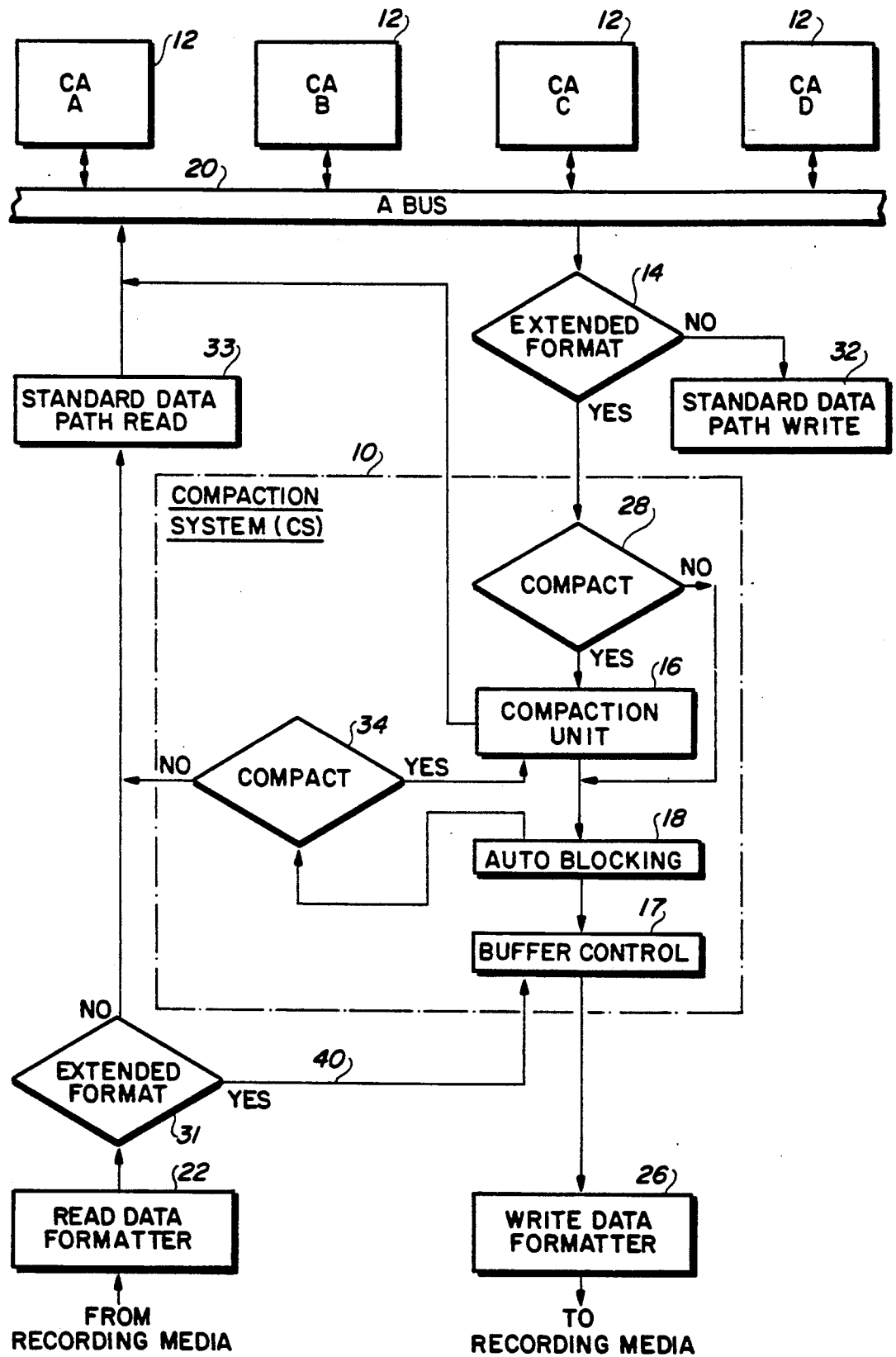

Referring to FIG. 1D, the compaction system (CS)10 is inserted into the standard read and write flow that interconnects the plurality of channel adaptors (CA) 12, to interface with the recording media 2. The CS10 uses a CA command set, extended format 14, see FIG. 1B, to direct data transfers through the CA interfaces. When the extended format command is off, that is, when the standard format is selected, an extended format decision block 14A, takes the NO decision line and the CS10 is bypassed. The standard read and write data paths 32 and 33, control the data transfer. When the extended format is selected, the YES line from block 14A, shows the path continues to the CS10. The CS10 controls the status, transfer of data, and error function of the compaction process. The CS10 includes a compaction unit 16, and an autoblocking unit 18. The buffer control 17 is logically not part of the compaction system 10 but physically is part of the total microcode package.

The compaction unit 16, when the extended format is selected, compacts data during the channel write operation and decompacts data during the channel read operation. Data compaction is performed by using a modified version of the binary arithmetic compaction (BAC) program, explained in the article: *An Introduction To Arithmetic Coding*, by Glen G. Langdon, Jr., IBM Journal of Research and Development, Volume 28, Number 2, March 1984. The compaction unit 16 includes a plurality of compaction processors, see FIG. 6. Data is encoded and decoded by each CP at the rate of 1.25 mega bytes per second. Each CP added in parallel, permits an additional 1.25 mega bytes per second encoding and decoding rate, thus increasing the data processing rate.

Referring to FIG. 1D, the compaction system 10, according to the present invention, includes the compaction unit 16, and the autoblocking unit 18. The compaction system 10, is connected via an A-bus 20, to the plurality of channel adaptors (CA)12. The channel adaptors in turn are connected to host computer processing units (see FIG. 1A) in a manner well known in the art. On a write cycle, it is first determined whether the extended format is activated or not. If not, the write flow extends down a standard data path, write process, shown as block 32, which then follows the write data path as shown in a write data formatter 26, to the recording media 2 via the write circuit 26A and the transducer 4 of the tape recording device 9. If the extended format is selected, the Yes line from the decision block 14A, is taken and the decision in block 28 is whether the data is to be compacted and autoblocked, YES line, or only autoblocked, NO line.

As will be discussed in more detail later, the compaction system 10, receives the unformatted data from the CAs 12, and separates the unformatted data into identical size blocks or sets of data. The individual sets of data are then directed to individual encoders (FIG. 4) in the compaction unit 16, for compression of each set in turn by the different encoder units. The compacted sets of data are then reassembled and directed to the autoblocking 18, which formats the data to combine a group of the individual sets. For storage of the data and later identification, one interblock gap (IBG) signal is inserted after each group. The formatted data is stored into the buffer control 17, for later transmission to the write data formatter 26, for actual placement onto the media 2.

The reverse is true on the read cycle. A read data formatter 22, removes the formatted data from the media 2 via the transducer 4, the read circuit 22B, and the read detect 22A, and stores it into a buffer in the read data formatter 22. Data control signals accompanying the data determine whether the data had been compacted, or autoblocked, or not. The first decision is whether the data has been written on the media using the extended format is shown in block 31. If not, the NO line is taken and the standard data read path, represented by a block 33 (data cable 24 of FIG. 1B), is taken. For the YES decision, representing at least autoblocked data, the line 40 directs the data to the buffer control 17 and to the autoblocking 18 for separation of the blocked signals. If the data read from the media had not been compacted, the NO decision line is taken from a compact decision block 34, to take the standard data path read represented by block 33, to send the data, via the A-bus 20, to the required CA 12.

Figure 5:
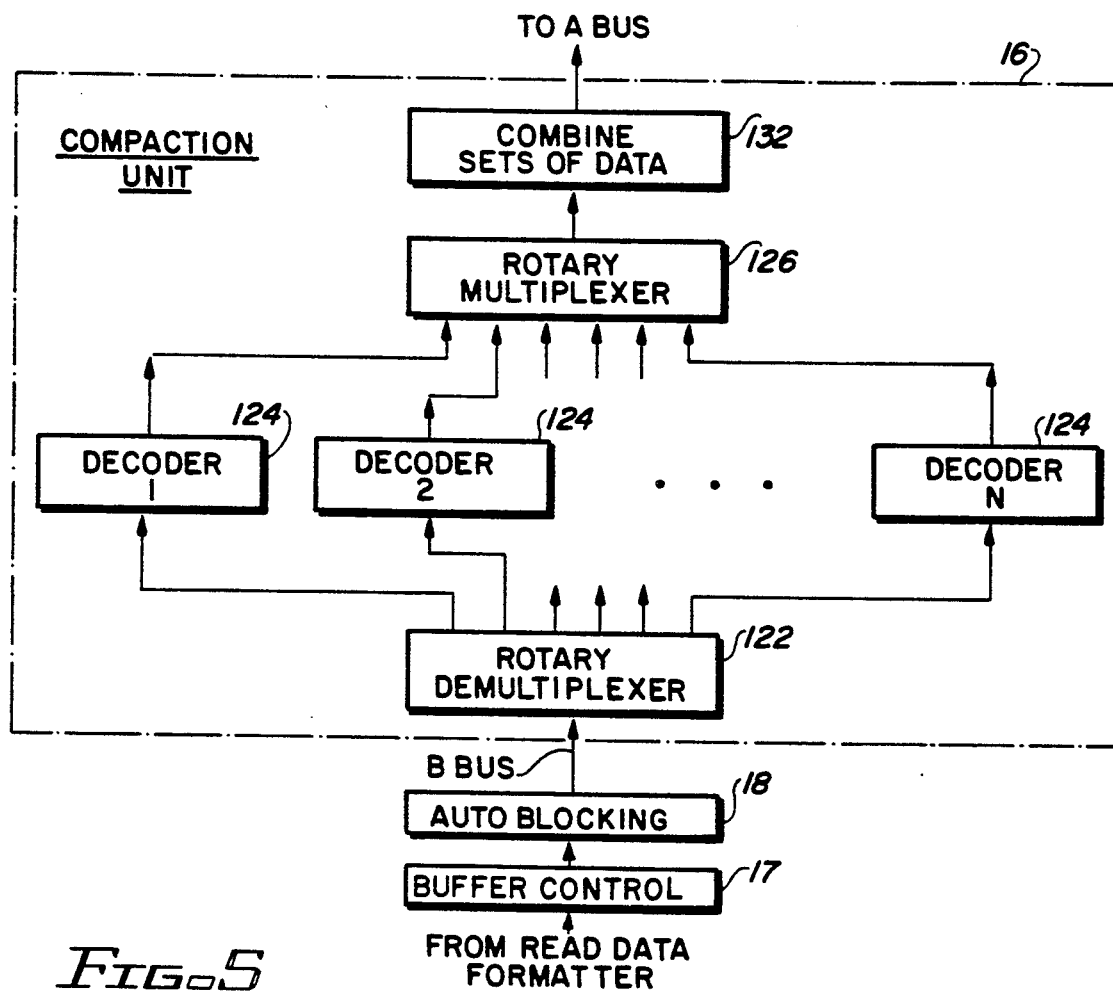
FIG. 5 is a diagrammatic representation of the compaction system of FIG. 1A, showing the read data flow.

If the data from the recorded media has been compacted, the compacted sets of data are directed on the YES line from block 34, to the compaction unit 16. The autoblocking circuit 17 with the buffer control 18, retrieves the compacted set of data. The compaction unit 16, separates them into the individual sets for decompaction and decoding by the individual decoders of the compaction unit 16. The decompacted sets of data are reassembled in the compaction unit 16, and placed into the original unformatted data sequence for transmission on a line 35, to the A-bus 20, and the CA units 12. The plurality of encode and decode units in the compaction unit permits an increase in the data flow rate through the compaction system since each code and decode unit handles individual sets which are then reassembled after encoding or decoding. Two encode and decode units, for instance, will double the throughput of data flow through the compaction system. A diagrammatic block flow diagram of the write data flow through the compaction system 10, is shown in FIG. 4 and a diagrammatic block diagram of the read data flow through the compaction system 10, is shown in FIG. 5.

Figure 2:
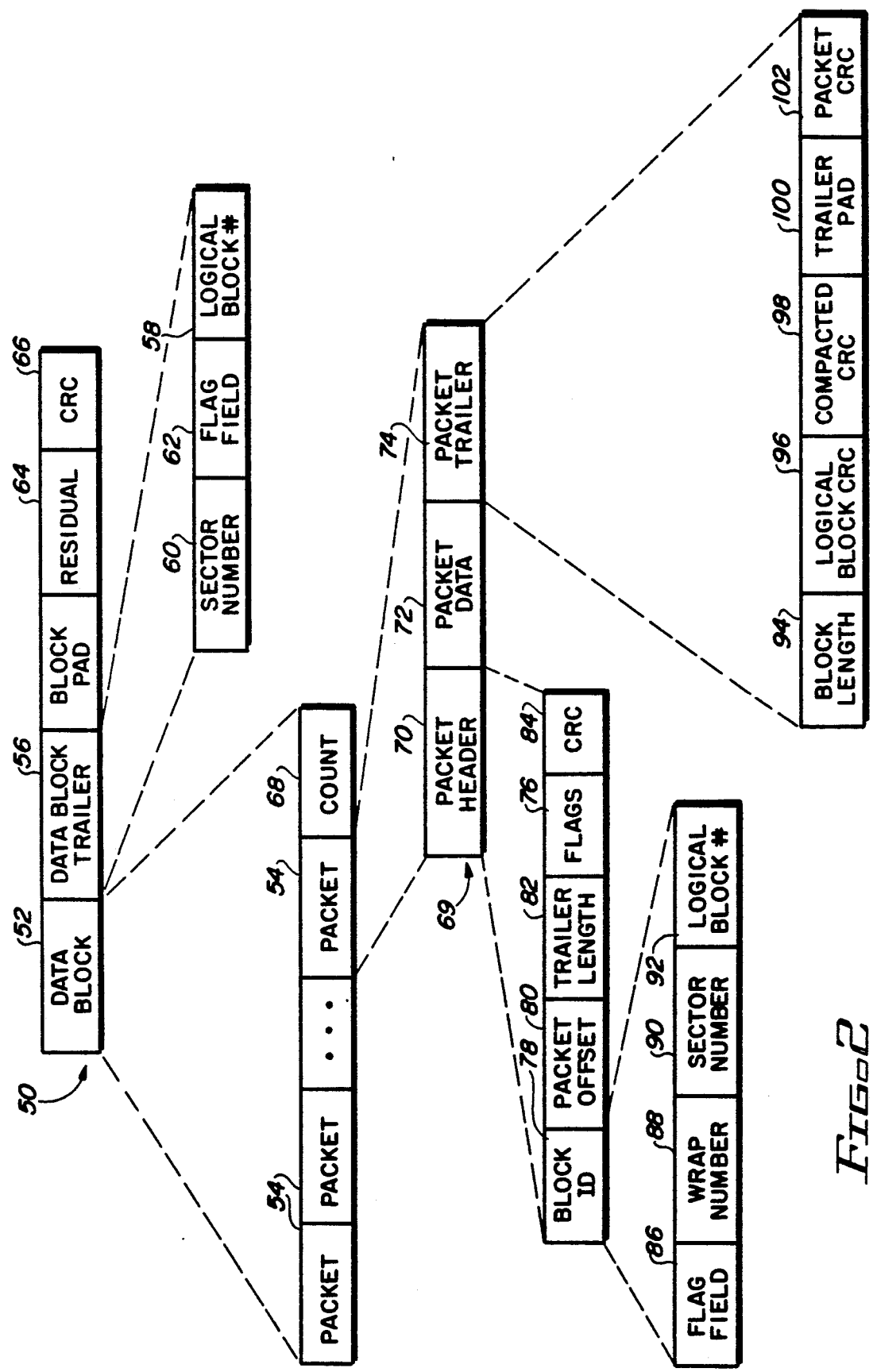
FIG. 2 shows the format of the data as written on the tape media according to FIG. 1A.

Blocks of data from the host computers may vary in length from 0 up to the maximum capacity of a single tape cartridge. A physical block format 50 stored on the tape media 2 by the device 9 is shown in FIG. 2 and describes the blocking of information within a physical block as it is formatted for recording onto the tape media. A data block field 52, contains the host data and other information which is used by the control unit to process the data block as it is read from the media. The field is variable in length. As shown in FIG. 2, it is the data block 52 information that contains the sets of data that are placed into packet form 54, by the autoblocking buffer control 18, as will be described later.

A data block trailer field 56 contains information about the location of the physical block on the tape media including a logical block sequence number 58, and a sector number 60. The tape 2 is divided into a number of sections called sectors. This information may be used when attempting to locate a given physical block on the tape media. The logical block number field 58, is sequentially incremented for each logical block or tape mark recorded on the media. There may be none, one, or more than one logical block per physical block so the logical block numbers 58 in the data block trailer may not be sequential. When there is more than one logical block within a physical block, the logical block number 58, in the data block trailer 56, is set equal to the logical block number of the first logical block in the physical block. A flag field 62, indicates the format of the physical block. It is this field that identifies whether the data is to be compacted or not.

A residual format section 64 insures that a cyclic redundancy check (CRC)66 is accomplished as well as including a count of the number of bad block bytes. The CRC characters are required in several places within the formats. These CRCs are all generated using the same CRC generator and only differ in the fields within the physical block over which they are generated. The CRC generator and error check are well known and will not be further described herein.

The number of packets within the data block is indicated in a packet count field 68. The number of packets allowed within the data block field is determined by the autoblocking process as will be discussed later. Each packet 54 includes its own format as shown in FIG. 2. Each packet includes a packet header 70, a packet data 72, and a packet trailer 74. The packet data field 72 contains the data received from the host in either compacted or noncompacted representation as determined by the compaction flag in the packet flag byte. A packet flag byte 76 is included in the packet header 70. When the packet data is not compacted, the packet data field 72 contains the data received from the host starting with the first byte of the packet data field.

The packet header 70 contains the block id field 78, a packet offset field 78, a packet trailer length field 82, the packet flag field 76, and a packet header CRC field 84. The block id field 78, of the packet header 70, contains a flag field 86, a wrap number field 88, a sector number field 90, and a logical block number field 92. The flag field 86, of the block id field 78, contains an indication of the format of the packet header 70. The wrap number field 88, indicates that the write paths or: the logical block is recorded. The sector number field 90 contains the same sector number field as defined for the data block trailer 56 above. The sector number field 90 indicates where the physical block is located on the media. The logical block number field 92 contains a sequential index number of each recorded logical block or tape mark. This number is incremented for each logical block or tape mark. When there are multiple packets 54, within a physical block, each packet 54 contains a logical block and is assigned a logical block number 92. The logical block number 58, in the data block trailer 56, is set equal to the logical block number of the first logical block within the physical block. It is possible to mix compacted and noncompacted formatted blocks within the same cartridge tape. The logical block numbers reflect the number of logical blocks and tape marks recorded on the tape media 2 independent of the other formats used.

The packet offset field 80 contains the offset value of the end of the packet data field. If each byte in a packet is assigned an address, and the address is incremented for each successive byte in the packet, the packet offset 80 is the address of the last data byte of the packet data field 54. The packet trailer length field 82 contains the length of the packet trailer 74. The sum of the packet offset 80, and the packet trailer length 82, is equal to the address of the last byte in the packet trailer 74. The packet flag field 76 contains flags which indicate the format information within the current packet. The flags indicate that this packet is the last packet in the data block and includes a compaction flag which indicates that the packet data field 76 has been compacted.

The contents of the packet trailer field 74 varies depending on whether the packet data field 54 is compacted or not. The packet trailer field 74 includes a logical block length field 94, which contains the length of the logical block before compaction. The two CRC fields 96 and 98 contain the CRC information generated for the logic block and for the packet data field after compaction. A packet trailer pad field 100, of the packet trailer field 74, is used to add bytes such that the entire packet field is an integral multiple of 32 bytes. A packet CRC field 102 contains the CRC information generated for the entire packet field.

Referring to FIG. 3, the formatting of the data through the compaction system 10, of FIG. 1A is shown. Data from the A-bus 20 is shown as a logical block of data 200. The data 200 is placed into equal lengths of data called sets 203, as shown in reference numeral 202. The identification of sets is done in the compaction unit 16, to make each set 203 an identical length of data except for the R or remainder section 204, which contains the remaining portion of the data that was not otherwise placed into sets. These sets of data are then directed for compaction, where they are shortened into a lesser amount of data as shown in the data of reference number 206. The remainder is compacted in a separate compacted character set 208, to compact only the remainder portion and to identify it as something less than a complete set of data. The compacted character sets of 206 are then directed to the autoblocking 18 in order to place the compacted data into a format which essentially places one inter block gap (IBG) for a sequence of a large amount of data. The IBG generally contains a large amount of data and uses up a rather large section of the tape media. Doing away with the individual IBGs between each section of data permits the further compaction of the data. The data out of the autoblocking unit is shown in reference number 69 of FIG. 2 which shows the packet header 70 and the packet data 72. The autoblock trailer 74, signifies that the autoblock sequence has reached its limit and the IBG is placed at the end of the autoblock trailer sequence. The parts of the compaction system 10 are shown in FIGS. 4 and 5.

Referring to FIG. 4, the data from the channel adaptors (CA) 12, are directed onto the A-bus 20, into a block 110 which is a portion of the compaction unit 16, of FIG. 1. As shown in the format of FIG. 3, the data block signals 200, are separated into individual sets 203, of data with each set of data according to preferred embodiment having 512 bytes of data. The set 203, of data identified in the block 110, are directed to a rotary multiplexer 112.

The compaction unit 16 includes the data set identifier 110, the rotary demultiplexer 112, a plurality of encoders 114, and a rotary multiplexer 116. The rotary demultiplexer 112, accepts the stream of data and directs one set in turn to each of the encoder units 114. For instance, the first set of data is directed to encoder 1, the second set of data to encoder 2, and so forth with the Nth set of data directed to the encoder N. The next set of data is then directed again to encoder 1. For instance with the preferred embodiment, four encoder units are located in the compaction unit with the logical block units placed into a modulo 8 count. Therefore, sets 0 and 4 are directed to encoder 1, sets 1 and 5 are directed to encoder 2, sets 2 and 6 are directed to encoder 3, and sets 3 and 7 are directed to encoder 4. The four encoder units actually comprise eight logical compactors because each encoder 114 includes two statistical tables. The eight logical compactors are selected for the band width requirements, with the overall result being that the eight logical compactors can process the data flow through the compaction unit in the same order as if eight physical compactors were used. The compacted sets of data, obtained from each encoder processing its 512 byte set of data, are placed in sequential order through the rotary multiplexer 116, for transfer to the autoblocking 18 and the buffer control unit 17.

The autoblocking process of FIG. 4, is used to determine when the number of packets within a physical block is sufficient to allow the autoblock 18 to be completed and written to the tape media. The process is executed after the reception of each logical block from the host computer. For a more complete description of the autoblock process, reference is made to the copending patent application, Ser. No. 372,744, filed on June 28, 1989 entitled "Combining Small Records Into A Signal Block For Recording On A Record Media", Dunn et al., and assigned to the assignee of the present invention. The process maintains the length of the largest packet received for the current open autoblock and also maintains the length of the currently open autoblock. The process determines that the autoblock should be closed if the length of the block plus some fraction of the largest received is greater than some threshold. The constant threshold determines the maximum autoblock length for fixed length packets. Since the compaction ratio varies with the data content, and the logical block length may vary on variable length files, the maximum may be considered the nominal autoblock threshold. The length of the autoblock in the preferred embodiment must not exceed 100 kilobytes.

If there are more than one physical block within the autoblock and the next physical block received causes the length of the currently open autoblock to exceed 100 kilobytes, that packet is not included in the current autoblock, the autoblock is closed and the packet that is not included must be retransmitted from the host computer for inclusion in a new autoblock. The resequenced compacted packets of data are assembled in the buffer control 17 and transmitted when required to the write data flow for writing on the media.

The decompression system used to retrieve the data from the media on a read cycle is shown in FIG. 5. Referring now to FIG. 5, the block flow for the read cycle to retrieve the data from the media is shown. The data from the recording media 2 via the transducer 4, the read circuit 22B and the read detect 22A is directed to the read data formatter 22, see FIGS. 1B and C. If the extended format has been entered to at least perform an autoblock compaction of the data, the YES line is taken from the decision block 31 (see FIG. 1D). The data is directed to the buffer control unit 17, and the data previously placed into autoblock form is deblocked in autoblock unit 18.

For purposes of explaining the total compaction procedure of this invention, on FIG. 5, the data has been compacted so the compacted sets of data are directed via the B-bus from the autoblocking 18 and the buffer control 17, to a rotary demultiplexer 122, of the compaction unit 16. On a read cycle, the compaction unit 16, includes the rotary demultiplexer 122, a plurality of decoder units 124, and a rotary multiplexer 126.

The compacted sets of data are directed to the rotary demultiplexer 122 for decompaction by the plurality of decoders 124, in turn. Thus the sets of data that were originally encoded and compacted by an individual encoder 114, are sent to one decoder 124, for decompaction. The same modulo eight count is used for the decoders 124. Therefore, for the preferred embodiment where four decoders 124, are used, the zero and fourth compacted sets of data are directed to decoder 1, the first and fifth are directed to decoder 2, the second and sixth sets of data are directed to decoder 3, and the third and seventh are directed to decoder 4. Similarly, each decoder 124 includes two logical decompactors, since each decoder includes two statistic tables. The decompacted sets of data are then directed to the rotary multiplexer 126, where they are reassembled into their original sequence and directed to a block 132. The block 132 takes the sets of data as originally divided and reformats them into the original data of logical block 200, as shown in the reverse direction for the format for FIG. 3. The compacted data is now placed into its original format for transmission to the CAs 12, on the A-bus 20, see FIG. 1A.

Figure 6:
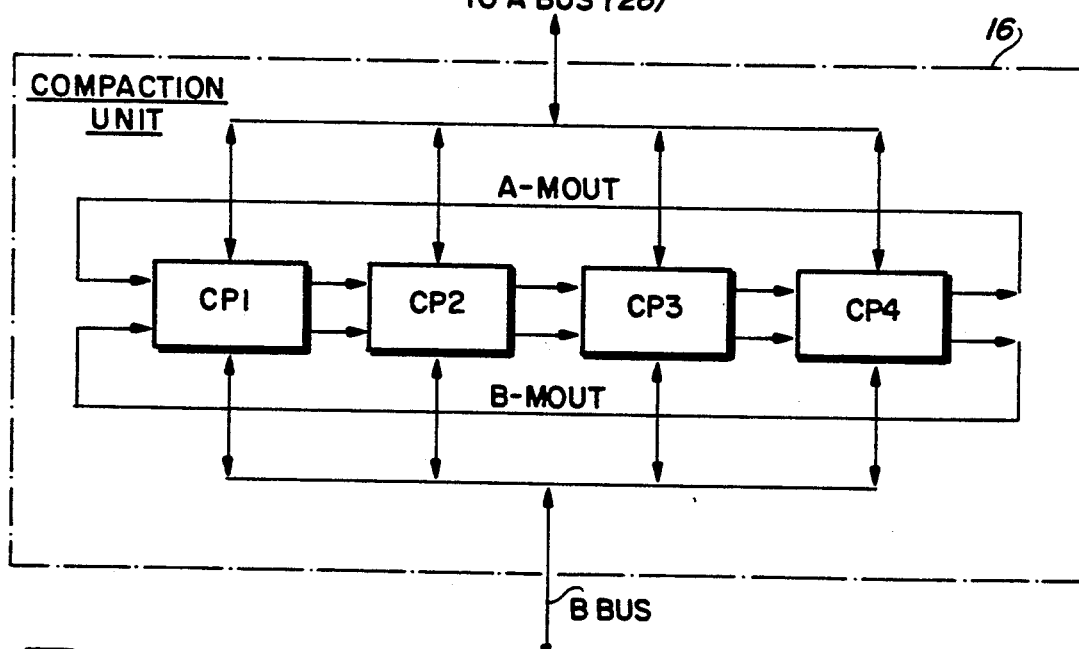
FIG. 6 is a more detailed block diagram of the compaction unit shown in FIG. 1D.

For the hardware included into the compaction unit 16 of FIG. 1D, reference is made to FIG. 6. As shown in FIG. 6, the compaction unit 16, includes a plurality of compaction processors, labeled CP1-CP4. As discussed previously, the sequence of sets of data are directed to the compaction unit 16. The compaction unit 16 compacts data during a channel write operation and decompacts data during a channel read operation. Data compactions is performed by using a modified version of the binary arithmetic compaction process explained in the article: *An Introduction to Arithmetic Coding,* by Glen G. Langdon, Jr. IBM Journal of Research and Development, Volume 28, Number 2, March 1984. Data is compacted or decompacted by each CP at the rate of 1.25 mega bytes per second. Therefore the four CP units of the preferred embodiment are used in parallel to achieve an approximate five megabyte data transfer rate. When compaction is required, the compaction unit 16, compacts a data record transferred during a write operation. Each CP unit receives and stores in its buffers 512 bytes of the original data record and then passes the interface control to the next CP unit in line. For example, control is passed from CP1 to CP2, from CP2 to CP3, and so forth. Only one CP can have interface control to accept a set of data at any one time during the data transfer. After the CP4 unit receives its set of data, it passes control to the CP1 unit. The signal that passes control from each CP unit in line is an A-mout signal for the upper half of the CP units and a B-mout signal for the lower half of the CP units. These signals will be explained more thoroughly with FIG. 7.

Each CP unit compacts the 512 bytes of original data from one set and appends control characters for that compacted data set, see FIG. 3. Each CP unit places its compacted data set into storage buffers for transfer to the autoblocking 18 when requested. The CP unit, under control of the buffer interface control, transfers its compacted set of data to the auto blocking unit 18 and then the buffer interface control controls the subsequent CP units in line, in order to place the compacted sets of data in the original sequence received. Only one CP unit can have the buffer interface control at any time during the data transfer. The hardware for each CP unit is shown in FIG. 7.

Figure 7:
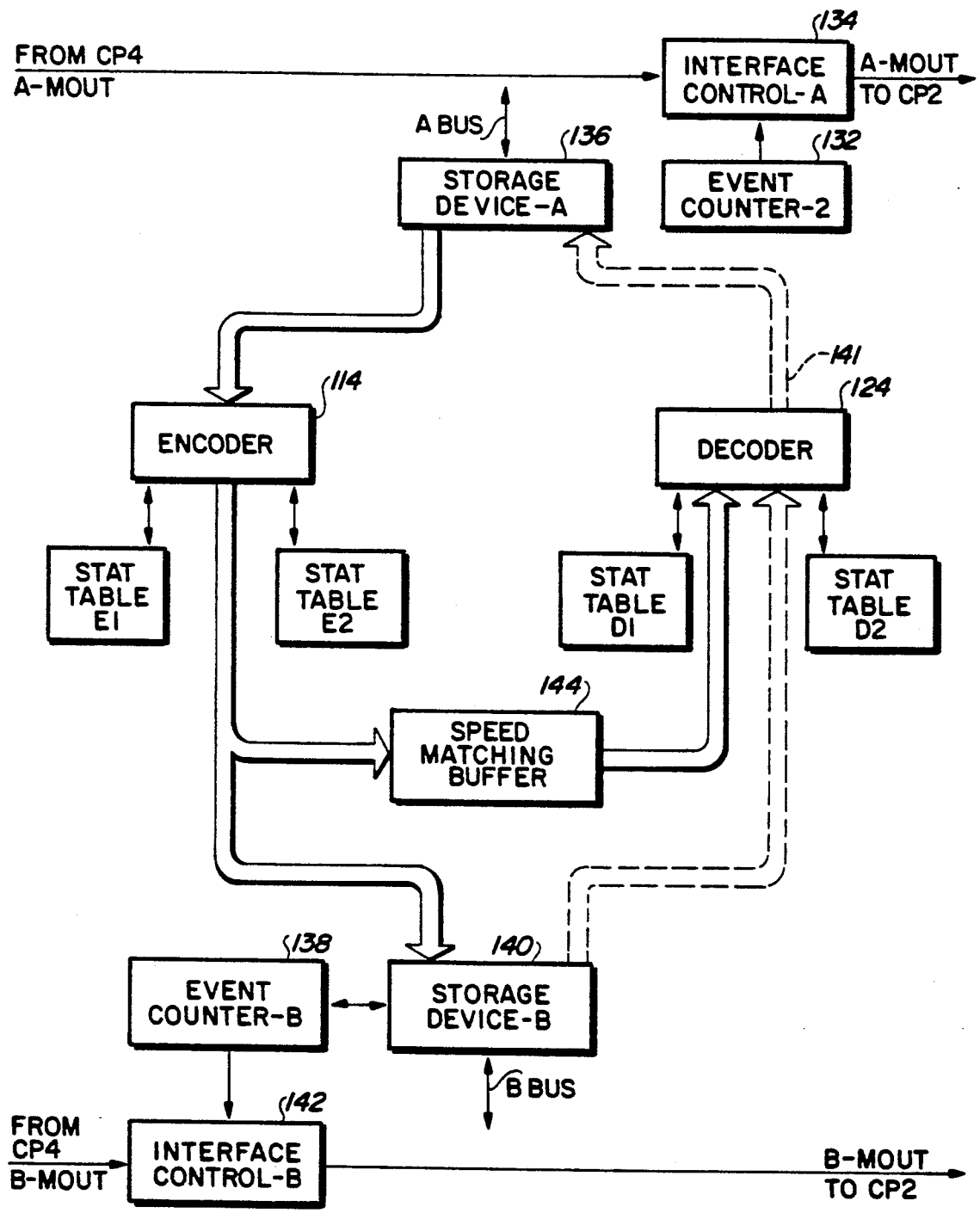
FIG. 7 is a more detailed block diagram of one section of the compaction processors of FIG. 6.

Referring now to FIG. 7, the CP-1 unit of FIG. 6 is shown in more detail. Each CP unit and CP-1, in particular, includes an event counter A 132, an interface control A 134, and a storage device A 136. These devices are unique to the top or A section of the CP-1. The bottom or B section of CP-1 also includes an event counter B 138, a storage device B 140, and an interface control B 142. The CP-1 also includes one encoder 114, one decoder 124, and a speed matching buffer 144. Two statistic tables, E1 and E2, are included with the encoder 114. Likewise, two statistic tables, D1 and D2, are included with the decoder 124. The event counter A and B are used in each of the compaction processors for the upper and lower interfaces to control and verify the splitting and merging of the respective data sets. Through the compaction processor as shown in FIG. 7, the need for separate multiplexer/demultiplexer control hardware on each interface is eliminated.

Assuming that CP-1 is activated which could be either through the initialization process or the transfer of control from the previous CP unit which is CP-4. The signal A-mout transfers the control from one CP unit to the next. On the write cycle the set of data is transmitted into the storage device A 136. The storage device A 136 signals the event counter A 132, that one set of data has been received.

The event counter A 132, in turn, signals the interface control A 134 unit that this compaction processor, CP1, has received its section of data, i.e., one set, and that the next set of data should be received by the CP-2 unit. On the write cycle, the set of data is transmitted using the solid lined bus shown in FIG. 7. The code for the different lines shown in FIG. 7 are a single solid line 146, signifies the control lines controlling the different blocks, the solid double lines 148 signify the write data flow (WDF). The signal transfers in the dashed dual-lined code 150 signifies the read data flow (RDF) signal flow through the CP-1 unit.

The set of data is transmitted from the storage device A 136, to the encoder 114, for compaction of the set of data. The encoder 114 in turn, after the compaction process is completed, transmits the compacted data to the speed matching buffer 144, and then to the decoder 124. The compacted data is transmitted to the speed matching buffer 144, for storage in order to match the output of the encoder 114, with that of the decoder 124. The just-compacted data is transferred from the speed matching buffer 144, to the decoder 124, for decompaction. The decoder 124, in turn transfers the decompacted data for checking (not shown). Essentially the transfer of the compacted data from the speed matching buffer 144 and to the decoder 124 on the write cycle is a readback check to verify that the set of data can essentially be encoded and decoded. The check is made using CRC units (not shown). The compacted data is transferred to the storage device B 140, where it will await the control by the event counter B 138, and the interface control B 142, to signal that the compressed set of data can be placed onto a B-bus for transfer to the autoblocking 18 and the buffer control unit 17.

On the read or retrieve data cycle to retrieve data from the media, the compacted sets of data are received by the buffer control 17, deautoblocked in autoblocking 18, and transmitted to the storage device B 140. The compacted bits of data information are stored within the storage device B until the entire set of data is received. At this time the event counter 138 is activated, which in turn activates the interface control B 142, to transfer control to CP2 via the B-mout signal line. CP2 can receive its set of data for use within its compaction processor. Using the RDF signal path, the stored compacted set is transferred to the decoder 124, where it is decompacted and then transmitted to storage device A 136 on line 141 for storage until the control is given to the interface control unit 134, that the storage device 136 can transmit information onto the A-bus 26 to the channel adaptors 12. After the decompacted data is transferred, the event counter 132 signals the interface controller to transfer the control via the A-mout signal line to the CP-2 unit. This is done such that the next set of data can be transferred from the CP-2 storage device A onto the A-bus and eventually to the channel adaptor. Thus, essentially the storage device A 136, the event counter A 132, and the interface control A unit 134 provide the multiplexer/demultiplexer for the upper unit of the compaction processor. Similarly, the storage device B 140, together with the event counter B 138, and the interface control B 142, perform the multiplexer/demultiplexer sequence for the lower section of the CP-1 unit. For a more complete description of the control and sequencing of the multiplexer parallel data processing of the compaction unit 16, reference is made to a copending patent application Ser. No. 07/441,127, filed on, Nov. 22, 1989, entitled "Control and Sequencing of Multiple Parallel Processing Devices", MacLean, et al.

The enhanced performance for the magnetic tape subsystem shown permits a higher channel rate while adding the compression of the data stored on the tape. An extended format and compaction command controls whether the data to be written is to be compacted or not. The compaction is active through the entire chain commands or until the sequence of write commands is interrupted by an end of the file signal. Intervening read commands do not cause the compaction channel command to be reset. The compaction mode can operates only with the autoblock mode. The standard or default mode of operation is where the compaction channel command is not set. If the channel command is set to compact the data, thereafter for the remainder of that chain of commands, the compaction is called for until the sequence of write commands is interrupted by an end of the file signal. During a read operation, whether the data is to be decompacted or not depends upon whether or not the data was originally compacted or not. A block trailer data group signals to the system whether the data block just read should be decompacted and, if it is, the data block is directed to the decompaction process. When the system is in the compaction mode, because the decompacted must match the original data, reading is permitted only in the forward or write direction. If there is no compacted data on the tape, reading is permitted in either forward or backward direction. Once the subsystem is in a read decompaction mode, that mode is maintained until an end of file signal is encountered on the tape or any noncompacted data block is encountered. Then the nondecompact mode is initiated.

In the overall compaction scheme of the enhanced tape drive shown, multiple compaction circuits are employed. To permit the use of the multiple compaction circuits, the data from the channel adaptors is first placed into equal lengths of data called sets. The sets for the preferred embodiment each contain 512 bytes of data. These sets of data are directed in turn through a demultiplexer to sequence the sets of data into each of the four compaction units of the preferred embodiment. The multiplexer sequences the data in a modulo 8 count with for instance the zero and fourth modulo count being directed to the first encoder and so forth until all 8 modulo counts of sets are directed to each of the four compaction encoders. Each of the compaction encoders includes two statistic tables thereby permitting one encoder to format the data stream in a compatible format with two encoders, each encoder having only one statistics table. The first statistic table handles the first modulo 8 count for the four encoders, while the second statistic table handles the second count of the modulo 8 count for the four encoders. The maximum data rate throughput handled by the compaction unit can be increased or decreased by increasing the number of encoders in the compression unit. For the preferred embodiment, each encoder handles 1.25 megabytes. Therefore, the data rate from the channel can be approximately 5 megabytes since four encoders are included in the compaction system. For a more complete description of the compaction/decompaction process and the compatibility of the format obtained with the use of two statistic tables, reference is made to copending patent application Ser. No. 07/441,681, filed on Nov. 22, 1989, entitled "Format Compatibility in Compression/Decompression Devices", MacLean, et al.

The compaction processor of the preferred embodiment uses a binary arithmetic code to accomplish the compression of the data. This code involves accessing statistic tables for the next byte based on the value of the byte or if the second byte is different from the first byte then the tables are accessed to anticipate the value of the next bit based on the value of the last bit of the not alike byte.

On a write data cycle, referring to FIG. 1A, the data from the channel adaptors is compacted and autoblocked in the compaction system 10 and formatted for writing in the format control 5. The write formatted data is directed to the data control 7 for activating the transducer 4 to write the compacted data onto tape media 2. While the data is being compacted, the channel adaptors 12 sends commands to the command unit 8 to control the data transfer through the control unit 13 and to control the device 9 and the drive 6 through the motion control 3 to transport the tape 2 past the transducer 4 to accomplish the storage of the data onto the tape 2.

On a read data cycle, using the advantages of the present invention, the channel adaptors 12 receive commands from the host CPU 11 to activate a read cycle. The commands control the command unit 8 to activate the device 6 of the tape recording device 9 through the motion control 3 to transport the tape media 2 past the transducer 4. The data read by the transducer 4 is directed to the data control 7 and to the format control 5 under control of the command unit 8. The data from the medium 2 is processed through the read data format control 5 portion of the tape system and, if the block of data was not originally compacted, the data is directed past the compaction system in the standard data path for the read cycle. The data is directed to the channel adaptors 12 for use by the host computers 11. If, however, the block of data read includes compacted data, the compacted data is directed into the compaction system 10 first for deblocking to remove the compacted sets of data from the autoblock scheme and to direct the compacted set of data through the demultiplexer into the decoding section of the compaction unit 16. The compaction unit 16 decodes the compacted data and places it into its original 512 bytes of data set length and resequences the sets for transmittal to the channel adaptors 12 since the data now is in the same state as when originally directed to the tape device 9.

Further description of the processing of the data on a tape media system is described in the Milligan, et al, U.S. Pat. No. 4,435,762.

While the invention has been particularly shown and described with reference to (a) preferred embodiment(s) thereof, it will be understood by those skilled in the art that various changes in form and details may be made therein without departing from the spirit and scope of the invention:

What is claimed is:

1. A compaction system for use in compressing a stream of data from a host processing unit for storage onto a recording media comprising:
   a first demultiplexer/multiplexer unit accepting the stream of data and separating the stream of data into sets of data of equal length, except for a remainder;
   a plurality of encoders, each accepting one set of data in sequential order from said first demultiplexer/multiplexer unit, with each processing its set into a compressed set of data;
   means for adding an identifying signal to each compressed set of data;
   a second demultiplexer/multiplexer unit accepting the compressed sets of data from each of said plurality of encoders and for combining and resequencing the compressed sets into their original sequence as received by said first demultiplexer/multiplexer unit;
   an autoblocking unit accepting the sequenced compressed sets of data to create a block of data from a plurality of the compressed sets and to add one data signal identifying a plurality of the blocks of compressed sets; and
   a write formatter accepting the blocks of compressed sets of data for storage onto the recording media.

2. A compaction system as defined by claim 1, further decompressing compressed data and further including a plurality of decoders and a read data unit and wherein:
   said read data unit retrieves the blocks of compressed sets of data from storage on the recording media;
   said autoblocking unit accepting the blocks of compressed sets of data from the read data unit and removing the added data signals from the compressed sets of data;
   said second demultiplexer/multiplexer unit accepting the compressed sets of data from said autoblocking unit and dividing the compressed sets into individual sets according to its identifying signal;
   each of said plurality of decoders accepting one compressed set of data in sequential order and processing the set into a decompressed set of data;
   said first demultiplexer/multiplexer unit accepting the decompressed sets from each decoder and reassembling the decompressed sets into the original sequence of the sets in the stream of data for transmission to the host processing unit.

3. A compaction system for use in compressing a stream of data from a host processing unit for storage onto a recording media comprising:
   means, including a first demultiplexer/multiplexer unit, for creating sets of data of equal length and a remainder, if required, from the stream of data received from the host;
   means including a plurality of encoders for compacting the sets of equal length data with each encoder in sequence handling a set of data and processing the set into a compressed set of data;
   means, including a second demultiplexer/multiplexer unit, for resequencing the compressed sets of data from said compacting means;
   means for autoblocking the resequenced compressed sets to add one data signal identifying a block of data formed by said autoblocking means from a plurality of the compressed sets;
   means for transferring the block of data for writing onto the media.

4. A compaction system as defined by claim 3, further including a plurality of decoders and a read data unit and wherein:
   said read data unit retrieves the blocks of compressed sets of data from storage on the recording media;
   said autoblocking means accepts the blocks of compressed sets of data from the read data unit and deblocks and removes the added data signals from the compressed sets of data;
   said second demultiplexer/multiplexer unit accepting the compressed sets of data from said autoblocking unit and dividing the compressed sets into individual sets according to its identifying signal;
   each of said plurality of decoders accepting one compressed set of data in sequential order and processing the set into a decompressed set of data;
   said first demultiplexer/multiplexer unit accepting the decompressed sets from each decoder and reassembling the decompressed sets into the original sequence of the sets in the stream of data for transmission to the host processing unit.

5. A compaction system for use in compressing a stream of data from a host processing unit for storage onto a recording media comprising:
   demultiplexing means for creating sets of data of equal length and a remainder from the stream of data received from the host;
   four encoding means for encoding the data sets into compressed sets of data, each of said encoding means accepting one set from the sequence of the plurality of sets from said demultiplexing means;

each of said encoding means including two statistic tables, one accessed by its associated encoding means in sequence, such that all eight statistic tables are accessed in sequence, once for every eighth set, to create an eight statistic table format for the encoding process;

multiplexing means for combining the compressed sets from said form encoding means to resequence the compressed sets of data into its original sequence before compression;

autoblocking means for accepting the resequenced compressed sets of data for creating a block of data from a plurality of the compressed sets and for adding one data signal identifying a plurality of the blocks of compressed sets;

means for writing the blocks of compressed data onto the recording media;

means for retrieving the blocks of compressed data from the recording media at the request of the host processing unit; and four decoding means for decoding compressed sets of data into its original set of data each of said decoding means including two statistic tables, one accessed by its associated decoding means in sequence, such that all eight statistic tables are accessed in sequence, once for every eighth set, to permit decoding using the eight statistic table format used for the encoding process;

wherein said autoblocking means unblocks the blocks of compressed data into the compressed sets of data before blocking;

wherein said multiplexing means acts as a demultiplexing means for separation of the compressed sets of data into individual sets for decoding by said decoding means in sequence; and wherein said demultiplexing means acts as a multiplexing means for resequencing the decompressed packets of data from said form of decoding means for use by the requesting host processing unit.

6. A compaction system for use in compressing a stream of data for storage comprising a compaction unit and an autoblocking unit;

said compaction unit including separating means for separating the stream of data into sets of data of equal length, except for a remainder and including a plurality of encoders, each accepting one set of data in sequential order with each processing its set into a compressed set of data and means for adding an identifying signal to each compressed set of data, and further including combining means for accepting the compressed sets of data from each of said plurality of encoders and for combining and resequencing the compressed sets into their original sequence as received;

said autoblocking unit accepting the sequenced compressed sets of data to create a block of data from a plurality of the compressed sets and to add one data signal identifying a plurality of the blocks of compressed sets; and storage means connected to receive the compressed sets of data as placed into blocks of data and identified by said autoblocking unit for storing the blocks of data.

7. A compaction system as defined by claim 6 further including a plurality of decoders for decompressing compressed data and wherein:

said autoblocking unit receiving the blocks of compressed sets of data from said storage means and removing the added data signals from the compressed sets of data and further separating the blocks of data into the compressed sets of data;

said combining means adapted to separate the compressed sets of data into individual compressed sets;

each of said plurality of decoders accepting one compressed set of data from said combining means in sequential order and processing the set into a decompressed set of data;

said separating means accepting the decompressed sets from each decoder and adapted to reassemble the decompressed sets into the original sequence of the sets in the stream of data.

8. A compaction system as defined in claim 7 wherein said plurality of encoders and decoders are each four in number.

9. A compaction system as defined in claim 8 wherein a modulo eight count is set for sequencing the sets of data for compression and decompression by said encoders and decoders, with the four encoders and decoders receiving every fourth set of data and repeating as necessary until all of the sets of data and any remainder of data is compressed and decompressed as needed.

10. A compaction system as defined in claim 9 wherein the sets of data compacted by one encoder of the four encoders is decompacted by one decoder, companion to the one encoder, of the four decoders.

11. A compaction system for use in compressing a stream of data for storage comprising:

means for creating sets of data of equal length and a remainder, if required, from the stream of data received;

means including a plurality of encoders for compacting the sets of equal length data with each encoder in sequence handling a set of data and processing the set into a compressed set of data;

means for resequencing the compressed sets of data from said compacting means;

means for autoblocking the resequenced compressed sets to add one data signal identifying each block of data formed by said autoblocking means from a plurality of the compressed sets;

storage means connected to receive the blocks of data and the identifying signal for storage.

12. A compaction system for use in compressing a stream of data for storage comprising:

demultiplexing means for creating sets of data of equal length and a remainder from the stream of data;

four encoding means for encoding the data sets into compressed sets of data, each of said encoding means accepting one set and every fourth set thereafter from the sequence of the plurality of sets from said demultiplexing means and operating under a modulo eight sequence;

each of said encoding means including two statistic tables, one accessed by its associated encoding means in sequence, such that all eight statistic tables are accessed in sequence, once for every eight set under the modulo eight sequence, to create an eight statistic table format for the encoding process;

multiplexing means for combining the compressed sets from said four encoding means to resequence the compressed sets of data into its original sequence before compression;

autoblocking means for accepting the resequenced compressed sets of data for creating at least one block of data from a plurality of the compressed sets and for adding one data signal identifying each of the blocks of compressed sets; and storage means connected to receive the blocks of compressed data for storage;

means for retrieving the blocks of compressed data from said storage means for transmittal to said autoblocking means; and four decoding means for decoding compressed sets of data into its original set of data each of said decoding means including two statistic tables, one accessed by its associated decoding means in sequence, such that all eight statistic tables are accessed in sequence, once for every eight set under the modulo eight sequence, to permit decoding using the eight statistic table format used for the encoding process;

wherein said autoblocking means unblocks the blocks of compressed data received from said storage means into the compressed sets of data before blocking;

wherein said multiplexing means acts as a demultiplexing means for separation of the compressed sets of data into individual sets for decoding by said decoding means in sequence; and wherein said demultiplexing means acts as a multiplexing means for resequencing the decompressed packets of data from said decoding means.

13. A compaction system as defined in claim 12 wherein the sets of data compacted by one encoding means of the four encoding means is decompacted by one decoding means, companion to the one encoding means, of the four decoding means.

14. A control unit connected to receive data and commands from a central processing unit for storing the data in a storage means, said control unit comprising adaptors for the transmission of data and commands to and from the central processing unit under command control of the central processing unit, a command unit to process the command controls, a compaction system for compressing the data, and a format control;

said compaction system including a compaction unit and an autoblocking unit;

said compaction unit including separating means for separating the stream of data into sets of data of equal length, except for a remainder, and a plurality of encoders, each accepting one set of data in sequential order with each processing its set into a compressed set of data, and further including means for adding an identifying signal to each compressed set of data, and combining means for accepting the compressed sets of data from each of said plurality of encoders and for combining and resequencing the compressed sets into their original sequence as received by said compaction unit;

said autoblocking unit accepting the sequenced compressed sets of data to create a block of data from a plurality of the compressed sets and to add one data signal identifying a plurality of the blocks of compressed sets;

said format control accepting the blocks of compressed sets of data from said autoblocking unit and for writing the compressed data into said storage means;

said command unit activating said compaction system, said format control and the storage means to process the data flow from the adaptors through said compaction system and said format control to write the blocks of compressed data into the storage means for storage therein.

15. A control unit as defined in claim 14 wherein said compaction unit further includes a plurality of decoders and wherein:

said format control under control of said command unit received the blocks of compressed data from the storage means as requested by the central processing unit;

said autoblocking unit deblocking the blocks of compressed sets of data from said format control and removing the added data signals from the compressed sets of data;

said combining means accepting the compressed sets of data from said autoblocking unit and further adapted to divide the compressed sets into individual sets according to its identifying signal;

each of said plurality of decoders accepting one compressed set of data in sequential order and processing the set into a decompressed set of data;

said separating means accepting the decompressed sets from each decoder and adapted for reassembling the decompressed sets into the original sequence of the sets in the stream of data;

said adaptors receiving a read command from the central processing unit and said command unit responsive thereto to activate said storage means to retrieve the stored blocks of compressed data, the blocks of compressed data being directed to said format control for processing.

16. A control unit as defined in claim 15 wherein said plurality of encoders and decoders are each four in number.

17. A control unit as defined in claim 16 wherein a modulo eight count is set for sequencing the sets of data for compression and decompression by said encoders and decoders, with the four encoders and decoders receiving every fourth set of data and repeating as necessary until all of the sets of data and any remainder of data is compressed and decompressed as needed.

18. A control unit as defined in claim 17 wherein the sets of data decompacted by one encoder of the four encoders is decompacted by one decoder, companion to the one encoded, of the four decoders.

19. A control unit as defined in claim 15 further including means controlled by said command unit for bypassing said compaction unit when compaction is not required on the data received by said adaptors.

20. A data processing system for compressing data from a central processing unit for storage on a media comprising:

a control unit including adaptors for the transmission of data and commands to and from the central processing unit under command control of the central processing unit, a command unit to process the command controls, a compaction system for compressing the data, and a format control; and a device including a drive for transporting the media past a transducer, a motion control under control of said command unit for controlling said drive, and a data control to activate the transducer to write data onto the media and to retrieve data from the media as the drive transports the media;

said compaction system including a compaction unit and an autoblocking unit;

said compaction unit including separating means for separating the stream of data into sets of data of equal length, except for a remainder, and a plurality of encoders, each accepting one set of data in sequential order with each processing its set into a compressed set of data, and further including means for adding an identifying signal to each compressed set of data, and combining means for accepting the compressed sets of data from each of said plurality of encoders and for combining and resequencing the compressed sets into their original sequence as received by said compaction unit;

said autoblocking unit accepting the sequenced compressed sets of data to create a block of data from a plurality of the compressed sets and to add one data signal identifying a plurality of the blocks of compressed sets;

said format control accepting the blocks of compressed sets of data from said autoblocking unit and transmitting the compressed sets of data to said data control for writing the compressed data onto the media under control of said command unit;

said command unit activating said motion control to control said drive and activating said compaction system and said format control to process the write data flow from the channel adaptors through said compaction system, said format control and said data control to write the blocks of compressed data onto the media for storage thereon.

21. A data processing system as defined in claim 20 wherein said compaction unit further includes a plurality of decoders and wherein:

said autoblocking unit deblocking the blocks of compressed sets of data received from the read data unit and removing the added data signals from the blocks of compressed sets of data;

said combining means accepting the compressed sets of data from said autoblocking unit and further adapted to divide the compressed sets into individual sets according to its identifying signal;

each of said plurality of decoders accepting one compressed set of data in sequential order and processing the set into a decompressed set of data;

said separating means adapted for accepting the decompressed sets from each decoder and reassembling the decompressed sets into the original sequence of the sets in the stream of data for transmission to said adaptors;

said adaptors receiving a read command from the central processing unit and said command unit responsive thereto to activate said motion control of said device to transport the media past the transducer to read the compressed data from the media, the compressed data being directed to said data control and said format control for processing and to said autoblocking unit of said compaction system for decompression.

22. A compaction system as defined in claim 21 wherein said plurality of encoder and decoders are each four in number.

23. A compaction system as defined in claim 22 wherein a modulo eight count is set for sequencing the sets of data for compression and decompression by said encoders and decoders receiving every fourth set of data and repeating as necessary until all of the sets of data and any remainder of data is compressed and decompressed as needed.

24. A compaction system as defined in claim 23 wherein the sets of data compacted by one encoder of the four encoders is decompacted by one decoder, companion to the one encoder, of the four decoders.

25. A data processing system as defined in claim 20 wherein said media is a magnetic tape media.

26. A data processing system as defined in claim 25 wherein said magnetic tape media is stored on a reel in a cartridge and said drive is adapted to remove the media from the cartridge by a threading mechanism which directs the media to a take-up reel past said transducer under control of said motion control, and includes drive motors to rotate the cartridge reel and the take-up reel, with both drive motors being controlled by said motion control as signalled by the tachometers connected to each drive motor and the tape tension device.

27. A data processing system for compressing data from a central processing unit for storage on a media comprising:

a control unit including channel for the transmission of data to and from the central processing unit under command control of the central processing unit, a command unit to process the command controls, a compaction system for compressing the data, and a format control; and a device including a drive for transporting the media past a transducer, a motion control under control of said command unit for controlling said drive, and a data control to activate the transducer to write data onto the media and to retrieve data from the media as the drive transports the media;

said compaction system including a first demultiplexer/multiplexer unit accepting the stream of data and separating the stream of data into sets of data of equal length, except for a remainder;

a plurality of encoders, each accepting one set of data in sequential order from said first demultiplexer/multiplexer unit, with each processing its set into a compressed set of data;

means for adding an identifying signal to each compressed set of data;

a second demultiplexer/multiplexer unit accepting the compressed sets of data from each of said plurality of encoders and for combining and resequencing the compressed sets into their original sequence as received by said first demultiplexer/multiplexer unit;

an autoblocking unit accepting the sequenced compressed sets of data to create a block of data from a plurality of the compressed sets and to add one data signal identifying a plurality of the blocks of compressed sets;

said format control accepting the blocks of compressed sets of data from said autoblocking unit and transmitting the compressed sets of data to said data control for writing the compressed data into the media under control of said command unit;

said command unit activating said motion control to control said drive and activating said compaction system and said format control to process the write data flow from the channel adaptors through said compaction systems, said format control and said data control to write the compressed data onto the media for storage thereon.

28. A data processing system as defined in claim 27 wherein said compaction system further includes a plurality of decoders and wherein:

said autoblocking unit accepting the blocks of compressed sets of data from the read data unit and removing the added data signals from the compressed sets of data;

said second demultiplexer/multiplexer unit accepting the compressed sets of data from said autoblocking unit and dividing the compressed sets into individual sets according to its identifying signal;

each of said plurality of decoders accepting one compressed set of data in sequential order and processing the set into a decompressed set of data;

said first demultiplexer/multiplexer unit accepting the decompressed sets from each decoder and reassembling the decompressed sets into the original sequence of the sets in the stream of data for transmission to the host processing unit;

said channel adaptors receiving a read command from the central processing unit and said command unit responsive thereto to activate said motion control of said device to transport the media past the transducer to read the compressed data from the media, the compressed data being directed to said data control and said format control for processing and to said autoblocking unit of said compaction system for decompression.

29. A data processing system as defined in claim 28 wherein said plurality of encoders and decoders are each four in number.

30. A compaction system for a data processing system as defined in claim 29 wherein a modulo eight count is set for sequencing the sets of data for compression and decompression by said encoders and decoders, with the four encoders and decoders receiving every fourth set of data and repeating as necessary until all of the sets of data and any remainder of data is compressed and decompressed as needed.

31. A compaction system for a data processing system as defined in claim 30 wherein the sets of data compacted by one encoder of the four encoders is decompacted by one decoder, companion to the one encoder, of the four decoders.

32. A data processing system for compressing data from a central processing unit for storage on a media comprising;

a control unit including channel adaptors for the transmission of data to and from the central processing unit under command control of the central processing unit, a command unit to process the command controls, a compaction system for compressing the data, and a format control; and a device including a drive for transporting the media past a transducer, a motion control under control of said command unit for controlling said drive, and a data control to activate the transducer to write data onto the media and to retrieve data from the media as the drive transports the media;

said compaction system including;

means for creating sets of data of equal length and a remainder from the stream of data received from the host;

means including a plurality of encoders for compacting the sets of equal length data with each encoder in sequence handling a set of data and processing the set into a compressed set of data;

means for resequencing the compressed sets of data from said compacting means;

means for autoblocking the resequenced compressed sets to add one data signal identifying a block of data formed by said autoblocking means from a plurality of the compressed sets;

said format control accepting the blocks of compressed sets of data from said autoblocking means and transmitting the compressed sets of data to said data control for writing the compressed data onto the media under control of said command unit; and said command unit activating said motion control to control said drive and activating said compaction system and said format control to process the write data flow from the channel adaptors through said compaction system, said format control and said data control to write the compressed data onto the media for storage thereon.

33. A data processing system as defined in claim 32 wherein said compaction system includes a plurality of decoders and wherein;

said channel adaptors receiving a read command from the control processing unit and said command unit responsive thereto to activate said motion control of said device to transport the media past the transducer to read the compressed data from the media, the compressed data being directed to said data control and said format control for processing and to said autoblocking unit of said compaction system for decompression;

said autoblocking means separates the block of data into the plurality of compressed sets;

said resequencing means separates the plurality of compressed sets of data into individual sets of compressed data;

said plurality of decoders each accepting one individual set of compressed data in sequential order and processing each set into a decompressed individual set of data;

said means for creating sets of data recombining the individual sets of decompressed data into the decompressed stream of data; and said channel adaptors receiving the decompressed stream of data directing the stream of data to the central processing unit.

34. A data processing system for compressing a stream of data from a central processing unit for storage onto a media comprising:

a control unit including channel adaptors for the transmission of data to and from the central processing unit under command control of the central processing unit, a command unit to process the command controls, a compaction system for compressing the data, and a format control; and a device including a drive from transporting the media past a transducer, a motion control under control of said command unit for controlling said drive, and a data control to activate the transducer to write data onto the media and to retrieve data from the media as the drive transports the media;

said compaction system including demultiplexing means for creating sets of data of equal length and a remainder from the stream of data received from the host;

four encoding means for encoding the data sets into compressed sets of data, each of said encoding means accepting one set from the sequence of the plurality of sets from said demultiplexing means;

each of said encoding means including two statistic tables, one accessed by its associated encoding means in sequence, such that all eight statistic tables are accessed in sequence, once for every eight set, to create an eight statistic table format for the encoding process;

multiplexing means for combining the compressed sets from said form encoding means to resequence the compressed sets of data into its original sequence before compression;

autoblocking means for accepting the resequenced compressed sets of data for creating a block of data from a plurality of the compressed sets and for adding one data signal identifying a plurality of the blocks of compressed sets;

said format control accepting the blocks of compressed sets of data and transmitting the compressed sets of data to said data control for writing the compressed data onto the media under control of said command unit; and said command unit activating said motion control to control said drive and activating said compaction system and said format control to process the write data flow from the channel adaptors through said compaction system, said format control and said data control to write the compressed data onto the media for storage thereon.

35. A data processing system as defined in claim 34 wherein said compaction system decompresses the compressed data and further includes;

four decoding means for decoding compressed sets of data into its original set of data each of said decoding means including two statistic tables, one accessed by its associated decoding means in sequence, such that all eight statistic tables are accessed in sequence, once for every eighth set, to permit decoding using the eight statistic table format used for the encoding process;

wherein said autoblocking means unblocks the blocks of compressed data into the compressed sets of data before blocking;

wherein said multiplexing means acts as a demultiplexing means for separation of the compressed sets of data into individual sets for decoding by said decoding means in sequence;

wherein said demultiplexing means acts as a multiplexing means for resequencing the decompressed packets of data from said four decoding means for use by the requesting host processing unit; and said channel adaptors receiving a read command from the central processing unit and said command unit responsive thereto to activate said motion control of said device to transport the media past the transducer to read the compressed data from the media, the compressed data being directed to said data control and said format control for processing and to said autoblocking unit of said compaction system for decompression.

36. A data processing system for compressing a stream of data from a central processing unit for storage onto a recording media and for retrieval and decompression and transmittal to the central processing unit comprising:

a control unit including channel adaptors for the transmission of data to and from the central processing unit under command control of the central processing unit, a command unit to process the command controls, a compaction system for compressing the data, and a format control; and a device including a drive for transporting the media past a transducer, a motion control under control of said command unit for controlling said drive, and a data control to activate the transducer to write data onto the media and to retrieve data from the media as the drive transports the media;

said compaction system including demultiplexing means for creating sets of data of equal length and a remainder from the stream of data received from the host;

four encoding means for encoding the data sets into compressed sets of data, each of said encoding means accepting one set from the sequence of the plurality of sets from said demultiplexing means;

each of said encoding means including two statistic tables, one accessed by its associated encoding means in sequence, such that all eight statistic tables are accessed in sequence, once for every eighth set, to create an eight statistic table format for the encoding process;

multiplexing means for combining the compressed sets from said form encoding means to resequence the compressed sets of data into its original sequence before compression;

autoblocking means for accepting the resequenced compressed sets of data for creating a block of data from a plurality of the compressed sets and for adding one data signal identifying a plurality of the blocks of compressed sets;

said format control accepting the blocks of compressed sets of data and transmitting the compressed sets of data to said control for writing the compressed data onto the media under control of said command unit;

said command unit activating said motion control to control said drive and activating said compaction system and said format control to process the write data flow from the channel adaptors through said compaction system, said format control and said data control to write the compressed data onto the media for storage thereon;

four decoding means for decoding compressed sets of data into its original set of data each of said decoding means including two statistic tables, one accessed by its associated decoding means in sequence, such that all eight statistic tables are accessed in sequence, once for every eighth set, to permit decoding using the eight statistic table format used for the encoding process;

wherein said autoblocking means unblocks the blocks of compressed data into the compressed sets of data before blocking;

wherein said multiplexing means acts as a demultiplexing means for separation of the compressed sets of data into individual sets for decoding by said decoding means in sequence;

wherein said demultiplexing means acts as a multiplexing means for resequencing the decompressed packets of data from said form of decoding means for use by the requesting host processing unit; and said channel adaptors receiving a read command from the central processing unit and said command unit responsive thereto to activate said motion control of said device to transport the media past the transducer to read the compressed data from the media, the compressed data being directed to said data control and said format control for processing and to said autoblocking unit of said compaction system for decompression.

37. A data processing system for compressing data from a central processing unit for storage on a media comprising a control unit including channel adaptors for the transmission of data to and from the central processing unit under command control of the central processing unit, a command unit to process the command controls, a compaction system for compressing the data, and a format control;

said compaction system including a first demultiplexer/multiplexer unit accepting the stream of data and separating the stream of data into sets of data of equal length, except for a remainder;

a plurality of encoders, each accepting one set of data in sequential order from said first demultiplexer/multiplexer unit, with each processing its set into a compressed set of data;

means for adding an identifying signal to each compressed set of data;

a second demultiplexer/multiplexer unit accepting the compressed sets of data from each of said plurality of encoders and for combining and resequencing the compressed sets into their original sequence as received by said first demultiplexer/multiplexer unit;

an autoblocking unit accepting the sequenced compressed sets of data to create a block of data from a plurality of the compressed sets and to add one data signal identifying a plurality of the blocks of compressed sets;

said format control accepting the blocks of compressed sets of data from said autoblocking unit and transmitting the compressed sets of data for writing onto the media under control of said command unit;

said command unit activating said compaction system and said format control to process the write data flow from the channel adaptors through said compaction system and said format control to write the compressed data onto the media for storage thereon.

38. A data processing system as defined in claim 37 wherein said compaction system further includes a plurality of decoders and wherein:

said autoblocking unit accepting the blocks of compressed sets of data from the read data unit and removing the added data signals from the compressed sets of data;

said second demultiplexer/multiplexer unit accepting the compressed sets of data from said autoblocking unit and dividing the compressed sets into individual sets according to its identifying signal;

each of said plurality of decoders accepting one compressed set of data in sequential order and processing the set into a decompressed set of data;

said first demultiplexer/multiplexer unit accepting the decompressed sets from each decoder and reassembling the decompressed sets into the original sequence of the sets in the stream of data for transmission to the host processing unit;

said channel adaptors receiving a read command from the central processing unit and said command unit responsive thereto to retrieve the compressed data from the media, the compressed data being directed to said format control for processing and to said autoblocking unit of said compaction system for decompression.

39. A data processing system for compressing data from a central processing unit for storage on a media comprising a control unit including channel adaptors for the transmission of data to and from the central processing unit under command control of the central processing unit, a command unit to process the command controls, a compaction system for compressing the data, and a format control;

said compaction system including;

means for creating sets of data of equal length and a remainder from the stream of data received from the host;

means including a plurality of encoders for compacting the sets of equal length data with each encoder in sequence handling a set of data and processing the set into a compressed set of data;

means for resequencing the compressed sets of data from said compacting means;

means for autoblocking the resequenced compressed sets to add one data signal identifying a block of data formed by said autoblocking means from a plurality of the compressed sets;

said format control accepting the blocks of compressed sets of data from said autoblocking means and transmitting the compressed sets of data to said data control for writing the compressed data onto the media under control of said command unit; and said command unit activating said compaction system and said format control to process the write data flow from the channel adaptors through said compaction system and said format control to write the compressed data onto the media for storage thereon.

40. A data processing system as defined in claim 39 wherein said compaction system further includes a plurality of decoders and wherein;

said channel adaptors adapted to receive a read command from the control processing unit and said command unit responsive thereto to retrieve the compressed data from the media, the compressed data being directed to said format control for processing and to said autoblocking unit of said compaction system for decompression;

said autoblocking means separates the block of data into the plurality of compressed sets;

said resequencing means separates the plurality of compressed sets of data into individual sets of compressed data;

said plurality of decoders each accepting one individual set of compressed data in sequential order and processing each set into a decompressed individual set of data;

said means for creating sets of data recombining the individual sets of decompressed data into the stream of data; and said channel adaptors directing the stream of data to the central processing unit.

41. A data processing system for compressing a stream of data from a central processing unit for storage onto a media comprising a control unit including channel adaptors for the transmission of data to and from the central processing unit under command control of the central processing unit, a command unit to process the command controls, a compaction system for compressing the data, and a format control;

said compaction system including demultiplexing means for creating sets of data of equal length and a remainder from the stream of data received from the host;

four encoding means for encoding the data sets into compressed sets of data, each of said encoding means accepting one set from the sequence of the plurality of sets from said demultiplexing means;

each of said encoding means including two statistic tables, one accessed by its associated encoding means in sequence, such that all eight statistic tables are accessed in sequence, once for every eight set, to create an eight statistic table format for the encoding process;

multiplexing means for combining the compressed sets from said encoding means to resequence the compressed sets of data into its original sequence before compression;

autoblocking means for accepting the resequenced compressed sets of data for creating a block of data from a plurality of the compressed sets and for adding one data signal identifying a plurality of the blocks of compressed sets;

said format control accepting the blocks of compressed sets of data and transmitting the compressed sets of data to said data control for writing the compressed data onto the media under control of said command unit; and said command unit activating said motion control to control said drive and activating said compaction system and said format control to process the write data flow from the channel adaptors through said compaction system, said format control and said data control to write the compressed data onto the media for storage thereon.

42. A data processing system as defined in claim 41 wherein said compaction system decompresses the compressed data and further includes;

four decoding means for decoding compressed sets of data into its original set of data each of said decoding means including two statistic tables, one accessed by its associated decoding means in sequence, such that all eight statistic tables are accessed in sequence, once for every eighth set, to permit decoding using the eight statistic table format used for the encoding process;

wherein said autoblocking means unblocks the blocks of compressed data into the compressed sets of data before blocking;

wherein said multiplexing means acts as a demultiplexing means for separation of the compressed sets of data into individual sets for decoding by said decoding means in sequence;

wherein said demultiplexing means acts as a multiplexing means for resequencing the decompressed packets of data from said decoding means for use by the requesting host processing unit; and said channel adaptors receiving a read command from the central processing unit and said command unit and responsive thereto to accept the compressed data from the media, the compressed data being directed to said format control for processing and to said autoblocking unit of said compaction system for decompression.

43. A data processing system for compressing a stream of data from a central processing unit for storage onto a recording media and for retrieval and decompression and transmittal to the central processing unit comprising a control unit including channel adaptors for the transmission of data to and from the central processing unit under command control of the central processing unit, a command unit to process the command controls, a compaction system for compressing the data, and a format control;

said compaction system including demultiplexing means for creating sets of data of equal length and a remainder from the stream of data received from the host;

four encoding means for encoding the data sets into compressed sets of data, each of said encoding means accepting one set from the sequence of the plurality of sets from said demultiplexing means;

each of said encoding means including two statistic tables, one accessed by its associated encoding means in sequence, such that all eight statistic tables are accessed in sequence, once for every eighth set, to create an eight statistic table format for the encoding process;

multiplexing means for combining the compressed sets from said form encoding means to resequence the compressed sets of data into its original sequence before compression;

autoblocking means for accepting the resequenced compressed sets of data for creating a block of data from a plurality of the compressed sets and for adding one data signal identifying a plurality of the blocks of compressed sets;

said format control accepting the blocks of compressed sets of data and transmitting the compressed sets of data for writing onto the media under control of said command unit;

said command unit activating said compaction system and said format control to process the write data flow from the channel adaptors through said compaction system and said format control to write the compressed data onto the media for storage thereon;

four decoding means for decoding compressed sets of data into its original set of data each of said decoding means including two statistic tables, one accessed by its associated decoding means in sequence, such that all eight statistic tables are accessed in sequence, once for every eighth set, to permit decoding using the eight statistic table format used for the encoding process;

wherein said autoblocking means unblocks the blocks of compressed data into the compressed sets of data before blocking;

wherein said multiplexing means acts as a demultiplexing means for separation of the compressed sets of data into individual sets for decoding by said decoding means in sequence;

wherein said demultiplexing means acts as a multiplexing means for resequencing the decompressed packets of data from said decoding means for use by the requesting host processing unit; and said channel adaptors receiving a read command from the central processing unit and said command unit responsive thereto to retrieve the transducer to read the compressed data from the media, the compressed data being directed to said format control for processing and then to said autoblocking unit of said compaction system for decompression.

44. A data processing unit connected to receive data and commands comprising at least one adaptor for receiving data and commands, a command unit to process the command controls, a compaction system for compressing the data, and a format control;

said compaction system including a compaction unit and an autoblocking unit;

said compaction unit including separating means for separating the stream of data into sets of data of equal length, except for a remainder, and a plurality of encoders, each accepting one set of data in sequential order with each processing its set into a compressed set of data, and further including means for adding an identifying signal to each compressed set of data, and combining means for accepting the compressed sets of data from each cf said plurality of encoders and for combining and resequencing the compressed sets into their original sequence as received by said compaction unit;

said autoblocking unit accepting the sequenced compressed sets of data to create a block of data from a plurality of the compressed sets and to add one data signal identifying a plurality of the blocks of compressed sets;

said format control accepting the blocks of compressed sets of data from said autoblocking unit and for writing the compressed data into said storage means;

said command unit activating said compaction system, said format control and the storage means to process the data flow from the adaptors through said compaction system and said format control to write the blocks of compressed data into the storage means for storage therein.

45. A control unit as defined in claim 44 wherein said compaction unit further includes a plurality of decoders and wherein:

said format control under control of said command unit received the blocks of compressed data from the storage means;

said autoblocking unit deblocking the blocks of compressed sets of data from said format control and removing the added data signals from the compressed sets of data;

said combining means accepting the compressed sets of data from said autoblocking unit and further adapted to divide the compressed sets into individual sets according to its identifying signal;

each of said plurality of decoders accepting one compressed set of data in sequential order an processing the set into a decompressed set of data;

said separating means accepting the decompressed sets from each decoder and adapted for reassembling the decompressed sets into the original sequence of the sets in the stream of data;

said adaptors receiving a retrieve command and said command unit responsive thereto to activate s id storage means to retrieve the stored blocks of compressed data, the blocks of compressed data being directed to said format control for processing.

46. A control unit as defined in claim 45 wherein said plurality of encoders and decoders are each four in number.

47. A control unit as defined in claim 46 wherein a modulo eight count is set for sequencing the sets of data for compression and decompression by said encoders and decoders, with the four encoders and decoders receiving every fourth set of data and repeating as necessary until all of the sets of data and any remainder of data is compressed and decompressed as needed.

48. A control unit as defined in claim 45 wherein the sets of data decompacted by one encoder of the four encoders is decompacted by one decoder, companion to the one encoder, of the four decoders.

49. A control unit as defined in claim 45 further including means controlled by said command unit for bypassing said compaction unit when compaction is not required on the data received by said adaptors.

50. A data processing system for compressing data for storage on a media comprising:

at least one adaptor for receiving data and commands, a command unit to process the commands, a compaction system for compressing the data, and a format control; and a device including a drive for transporting the media past a transducer, a motion control under control of said command unit for controlling said drive, and a data control to activate the transducer to write data onto the media and to retrieve data from the media as the drive transports the media;

said compaction system including a compaction unit and an autoblocking unit;

said compaction unit including separating means for separating the stream of data into sets of data of equal length, except for a remainder, and a plurality of encoders, each accepting one set of data in sequential order with each processing its set into a compressed set of data, and further including means for adding an identifying signal to each compressed set of data, and combining means for accepting the compressed sets of data from each of aid plurality of encoders and for combining and resequencing the compressed sets into their original sequence as received by said compaction unit;

said autoblocking unit accepting the sequenced compressed sets of data to create a block of data from a plurality of the compressed sets and to add one data signal identifying a plurality of the blocks of compressed sets;

said format control accepting the blocks of compressed sets of data from said autoblocking unit and transmitting the compressed sets of data to said data control for writing the compressed data onto the media under control of said command unit;

said command unit activating said motion control to control said drive and activating said compaction system and said format control to process the write data flow from the channel adaptors through said compaction system, said format control and said data control to write the blocks of compressed data onto the media for storage thereon.

51. A data processing system as defined in claim 50 wherein said compaction unit further includes a plurality of decoders and wherein:

said autoblocking unit deblocking the blocks of compressed sets of data received from the read data unit and removing the added data signals from the blocks of compressed sets of data;

said combining means accepting the compressed sets of data from said autoblocking unit and further adapted to divide the compressed sets into individual sets according to its identifying signal;

each of said plurality of decoders accepting one compressed set of data in sequential order and processing the set into a decompressed set of data;

said separating means adapted for accepting the decompressed sets from each decoder and reassembling the decompressed sets into the original sequence of the sets in the stream of data for transmission to said adaptors;

said adaptor receiving a read command and said command unit responsive thereto to activate said motion control of said device to transport the media past the transducer to read the compressed data from the media, the compressed data being directed to said data control and said format control for processing and to said autoblocking unit of said compaction system for decompression.

52. A data processing system as defined in claim 50 wherein said media is a magnetic tape media.

53. A data processing system as defined in claim 52 wherein said magnetic tape media is stored in a cartridge and said drive is adapted to remove the media from the cartridge past said transducer under control of said motion control, and includes a motor drive to rotate the cartridge reel and the take-up reel, with the motor drive being controlled by said motion control.

* * * * *

UNITED STATES PATENT AND TRADEMARK OFFICE
CERTIFICATE OF CORRECTION

PATENT NO. : 5,097,261
DATED : March 17, 1992
INVENTOR(S) : G. G. Langdon, Jr., et al.

It is certified that error appears in the above-identified patent and that said Letters Patent is hereby corrected as shown below:

Column 23:
Claim 22   Line 1    Change "compaction" to --data processing--

Line 22   Change "encoder" to --encoders--

Claim 23   Line 1    Change "compaction" to --data processing--

Column 24:
Claim 24   Line 1    Change "compaction" to --data processing--

Column 32:
Claim 44   Line 1    Change "data processing" to --control--.

Signed and Sealed this

Fifteenth Day of June, 1993

Attest:

MICHAEL K. KIRK

*Attesting Officer*   Acting Commissioner of Patents and Trademarks